US012677577B2

(12) United States Patent
Wang

(10) Patent No.: US 12,677,577 B2
(45) Date of Patent: Jul. 7, 2026

(54) DISPLAY SUBSTRATE WITH ANTIREFLECTION STRUCTURE, MANUFACTURING METHOD THEREOF AND DISPLAY APPARATUS

(71) Applicant: BOE TECHNOLOGY GROUP CO., LTD., Beijing (CN)

(72) Inventor: Hejin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 821 days.

(21) Appl. No.: 17/796,648

(22) PCT Filed: Sep. 17, 2021

(86) PCT No.: PCT/CN2021/119016
§ 371 (c)(1),
(2) Date: Jul. 30, 2022

(87) PCT Pub. No.: WO2023/039821
PCT Pub. Date: Mar. 23, 2023

(65) Prior Publication Data
US 2024/0188401 A1 Jun. 6, 2024

(51) Int. Cl.
*H10K 59/80* (2023.01)
*H10K 59/12* (2023.01)
(Continued)

(52) U.S. Cl.
CPC ..... *H10K 59/8791* (2023.02); *H10K 59/1201* (2023.02); *H10K 59/879* (2023.02);
(Continued)

(58) Field of Classification Search
CPC ........... H10K 59/8791; H10K 59/1201; H10K 59/879; H10K 59/65; H10K 59/873; H10K 59/38
See application file for complete search history.

(56) References Cited

U.S. PATENT DOCUMENTS 10,818,695 B2    10/2020 Zhang et al.
10,998,385 B2    5/2021 Zuo et al.
(Continued)

FOREIGN PATENT DOCUMENTS

CN        106295527 A      1/2017
CN        108363235 A      8/2018
(Continued)

*Primary Examiner* — Norman D Richards
*Assistant Examiner* — Sean Ayers Winters
(74) *Attorney, Agent, or Firm* — HOUTTEMAN LAW LLC

(57) ABSTRACT
An embodiment of the present disclosure provides a display substrate, including: a base substrate; a plurality of pixels on a side of the base substrate, the pixel including at least one light emitting unit; and an antireflection structure on a side of the light emitting unit away from the base substrate, wherein the antireflection structure is divided into antireflection regions, an orthographic projection of the antireflection region on the base substrate does not overlap an orthographic projection of the light emitting unit on the base substrate, and the antireflection region of the antireflection structure is configured to reduce light reflectivity of light incident from a side of the antireflection structure away from the base substrate and allow a part of the light irradiating the antireflection region to be transmitted. An embodiment of the present disclosure further provides a display apparatus and a method for manufacturing the display substrate.

14 Claims, 22 Drawing Sheets

(51) Int. Cl.
  *H10K 59/38* (2023.01)
  *H10K 59/65* (2023.01)
(52) U.S. Cl.
  CPC ............. *H10K 59/38* (2023.02); *H10K 59/65* (2023.02); *H10K 59/873* (2023.02)

(56) References Cited

U.S. PATENT DOCUMENTS

| | | | |
|---|---|---|---|
| 2001/0035929 A1 | 11/2001 | Nakamura et al. | |
| 2015/0001474 A1* | 1/2015 | Park | H10K 50/82 |
| | | | 257/40 |
| 2015/0022495 A1* | 1/2015 | Bussat | G06F 3/0448 |
| | | | 345/173 |
| 2015/0062497 A1* | 3/2015 | Nam | G02F 1/133536 |
| | | | 349/96 |
| 2016/0155789 A1* | 6/2016 | Kim | H10K 59/121 |
| | | | 257/40 |
| 2016/0282987 A1* | 9/2016 | Choi | G06F 3/0412 |
| 2018/0011385 A1* | 1/2018 | Kang | H10K 50/856 |
| 2018/0365471 A1* | 12/2018 | Xin | H10K 59/1216 |
| 2019/0332844 A1* | 10/2019 | Liu | G06V 40/1318 |
| 2020/0043992 A1* | 2/2020 | Zuo | H10K 59/60 |

FOREIGN PATENT DOCUMENTS

| | | | | | |
|---|---|---|---|---|---|
| CN | 109065756 A | | 12/2018 | | |
| CN | 109213348 A | * | 1/2019 | .......... | G06F 3/0412 |
| CN | 111162110 A | * | 5/2020 | .......... | H10K 50/865 |
| CN | 111584752 A | | 8/2020 | | |
| CN | 111722757 A | | 9/2020 | | |

* cited by examiner

Fingerprint
identification region

Non-fingerprint
identification region

Providing a base substrate — S101

Forming a plurality of pixels on a side of
the base substrate — S102

Forming an antireflection structure on a side of
the light emitting unit away from the base substrate — S103

S103

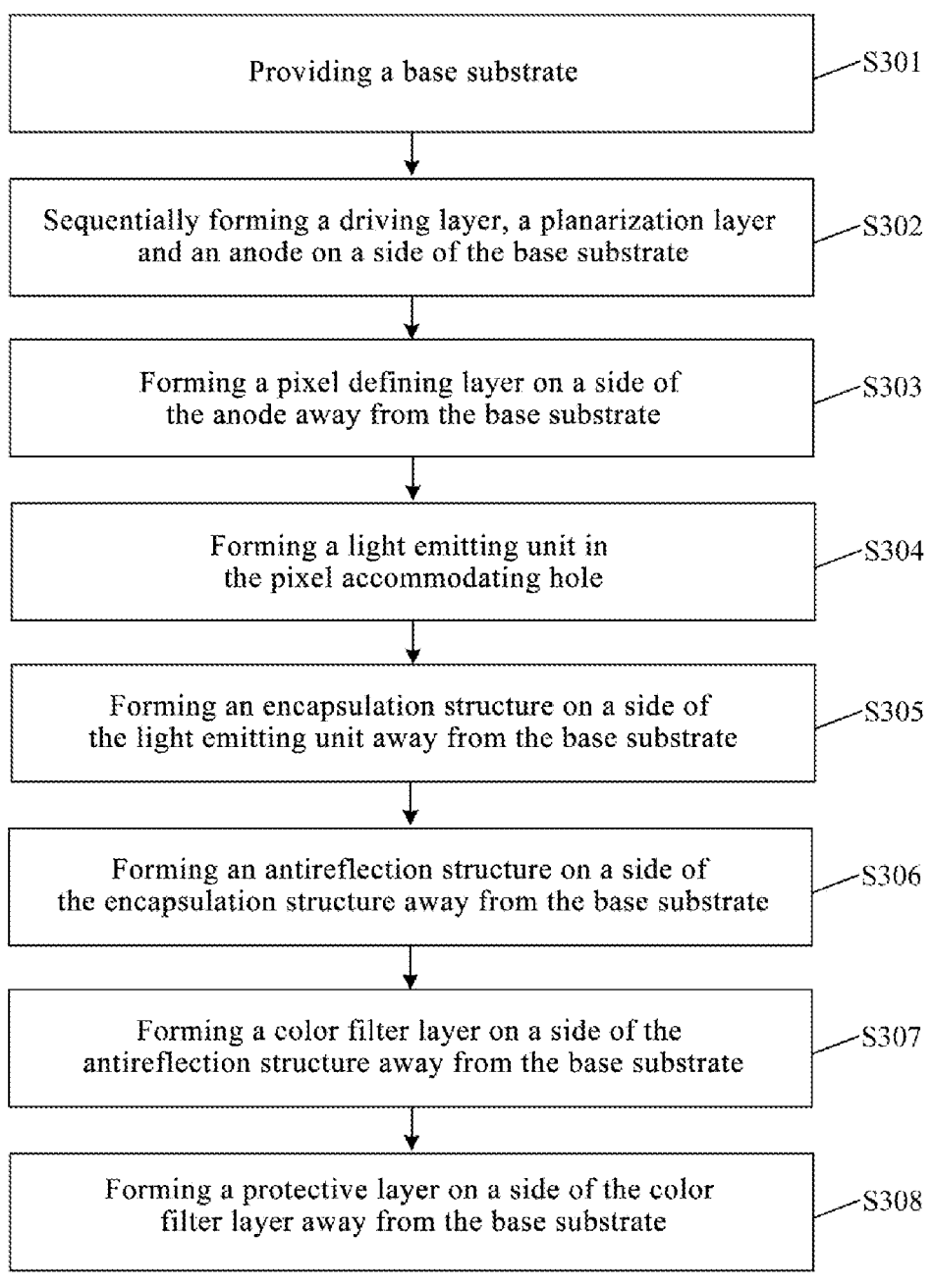

Providing a base substrate — S301

Sequentially forming a driving layer, a planarization layer and an anode on a side of the base substrate — S302

Forming a pixel defining layer on a side of the anode away from the base substrate — S303

Forming a light emitting unit in the pixel accommodating hole — S304

Forming an encapsulation structure on a side of the light emitting unit away from the base substrate — S305

Forming an antireflection structure on a side of the encapsulation structure away from the base substrate — S306

Forming a color filter layer on a side of the antireflection structure away from the base substrate — S307

Forming a protective layer on a side of the color filter layer away from the base substrate — S308

FIG. 33

DISPLAY SUBSTRATE WITH ANTIREFLECTION STRUCTURE, MANUFACTURING METHOD THEREOF AND DISPLAY APPARATUS

CROSS-REFERENCE TO RELATED APPLICATION

This is a National Phase Application filed under 35 U.S.C. 371 as a national stage of PCT/CN2021/119016, filed Sep. 17, 2021, titled "display substrate, manufacturing method thereof and display apparatus", the contents of which is hereby incorporated by reference in its entirety.

TECHNICAL FIELD

The present disclosure relates to the field of display technology, and in particular, to a display substrate, a manufacturing method thereof and a display apparatus.

BACKGROUND

An Organic Light emitting Diode (OLED) display apparatus has many advantages, such as self-luminescence, ultrathinness, fast response speed, high contrast, and wide viewing angle, and is a display panel that receives extensive attention at present.

SUMMARY

In a first aspect, an embodiment of the present disclosure provides a display substrate, including:

a base substrate;

a plurality of pixels on a side of the base substrate, wherein each of the plurality of pixels includes at least one light emitting unit; and an antireflection structure on a side of the light emitting unit away from the base substrate, wherein the antireflection structure is divided into antireflection regions, an orthographic projections of the antireflection region on the base substrate does not overlap an orthographic projection of the light emitting unit on the base substrate, and the antireflection region is configured to reduce light reflectivity of light incident from a side of the antireflection structure away from the base substrate and allow a part of light irradiating the antireflection regions to be transmitted.

In some embodiments, the antireflection structure further includes transmission regions in addition to the antireflection regions, and the transmission region is configured to allow transmission of at least a part of light irradiating the transmission region.

In some embodiments, the antireflection structure includes:

a transflective layer, which is provided with a first via in the transmission region;

a first dielectric layer, which is at least in the antireflection region, wherein the first dielectric layer is on a side of the transflective layer away from the base substrate and in contact with a surface of the transflective layer away from the base substrate;

wherein the first dielectric layer is configured such that: light is incident into the first dielectric layer from a side of the first dielectric layer away from the base substrate and is reflected at the transflective layer, when first reflected light formed by the light reflected at the transflective layer returns to a surface of the first dielectric layer away from the base substrate, destructive interference between the first reflected light and second reflected light occurs, wherein the second reflected light is formed by light reflected at the surface of the first dielectric layer away from the base substrate.

In some embodiments, the antireflection structure further includes:

a second dielectric layer, which is at least in the antireflection region, wherein the second dielectric layer is on a side of the transflective layer close to the base substrate and in contact with a surface of the transflective layer close to the base substrate;

wherein the second dielectric layer is configured such that: light is incident into the second dielectric layer from the side of the second dielectric layer close to the base substrate and is reflected at the transflective layer, when third reflected light formed by the light reflected at the transflective layer returns to a surface of the second dielectric layer close to the base substrate, destructive interference between the third reflected light and fourth reflected light occurs, wherein the fourth reflected light is formed by light reflected at the surface of the second dielectric layer close to the base substrate.

In some embodiments, the display substrate includes one of the first dielectric layer, N of the transflective layers, and N of the second dielectric layers, where N is greater than or equal to 2, and N is an integer;

the second dielectric layers and the transflective layers are sequentially and alternately arranged along a direction away from the base substrate; and the first dielectric layer is on a side of the transflective layer farthest from the base substrate, away from the base substrate, and is in contact with a surface of the transflective layer farthest from the base substrate, away from the base substrate.

In some embodiments, the first dielectric layer is further in the transmission region, and the first dielectric layer is multiplexed as a light extraction layer.

In some embodiments, the light extraction layer is of a single layer structure, a double layer structure, or a multi-layer structure.

In some embodiments, the first dielectric layer has a refractive index in a range from 1.35 to 2.0.

In some embodiments, a material of the second dielectric layer includes a transparent conductive material.

In some embodiments, a material of the transflective layer includes a metal material.

In some embodiments, the display substrate further includes:

a color filter layer on a side of the light emitting unit away from the base substrate, wherein the color filter layer includes a plurality of color filter patterns in a one-to-one correspondence with the light emitting units, and an orthographic projection of each of the plurality of color filter patterns on the base substrate covers an orthographic projection of the light emitting unit corresponding to the color filter pattern on the base substrate.

In some embodiments, the display substrate further includes:

an encapsulation structure between the light emitting unit and the color filter layer; and a protective layer on a side of the color filter layer away from the base substrate.

In some embodiments, the antireflection structure is between the light emitting unit and the encapsulation structure;

or the antireflection structure is between the encapsulation structure and the protective layer;

or the antireflection structure is on a side of the protective layer away from the base substrate.

In some embodiments, the antireflection structure is in a same layer as the color filter pattern, and a thickness of the color filter pattern is greater than a thickness of the antireflection structure; and an edge portion of the color filter pattern covers a surface of the antireflection structure away from the base substrate.

In some embodiments, the transmission regions are in a one-to-one correspondence with the light emitting units;

an orthographic projection of the color filter pattern on the base substrate covers an orthographic projection of the transmission region corresponding to the color filter pattern on the base substrate; and the orthographic projection of the transmission region on the base substrate covers an orthographic projection of the light emitting unit corresponding to the transmission region on the base substrate.

In some embodiments, the orthographic projection of the color filter pattern on the base substrate, the orthographic projection of the transmission region corresponding to the color filter pattern on the base substrate, and the orthographic projection of the light emitting unit corresponding to the color filter pattern on the base substrate have a same shape.

In some embodiments, a distance between an edge, on one side, of the orthographic projection of the color filter pattern on the base substrate and an edge, on this side, of the orthographic projection of the transmission region corresponding to the color filter pattern on the base substrate is d1; and a distance between an edge, on one side, of the transmission region corresponding to the color filter pattern on the base substrate and an edge, on this side, of the light emitting unit corresponding to the color filter pattern on the base substrate is d2, where d2 is greater than d1.

In some embodiments, the display substrate further includes:

a fingerprint identification module on a side of the light emitting unit close to the base substrate, wherein the fingerprint identification module includes a plurality of optical sensors, and an orthographic projection of each of the plurality of optical sensors on the base substrate does not overlap an orthographic projection of the light emitting unit on the base substrate.

In some embodiments, the display substrate includes a display region, the display region includes a fingerprint identification region and a non-fingerprint identification region, the fingerprint identification module is in the fingerprint identification region; and a ratio of a total area of the antireflection regions to a total area of the transmission regions in the fingerprint identification region is less than or equal to a ratio of a total area of the antireflection regions to a total area of the transmission regions in the non-fingerprint identification region.

In some embodiments, the ratio of the total area of the antireflection regions to the total area of the transmission regions in the fingerprint identification region is less than the ratio of the total area of the antireflection regions to the total area of the transmission regions in the non-fingerprint identification region;

a pixel density of the fingerprint identification region is equal to a pixel density of the non-fingerprint identification region; and the pixel includes an area-adjustable light emitting unit, and an area of an orthographic projection of one area-adjustable light emitting unit in the fingerprint identification region on the base substrate is less than an area of an orthographic projection of one area-adjustable light emitting unit in the non-fingerprint identification region on the base substrate.

In some embodiments, the ratio of the total area of the antireflection regions to the total area of the transmission regions in the fingerprint identification region is less than the ratio of the total area of the antireflection regions to the total area of the transmission regions in the non-fingerprint identification region;

a pixel density of the fingerprint identification region is less than a pixel density of the non-fingerprint identification region;

the pixel includes at least one light emitting unit, and for any type of light emitting unit, an area of an orthographic projection of one light emitting unit of this type in the fingerprint identification region on the base substrate is equal to an area of an orthographic projection of one light emitting unit of the same type in the non-fingerprint identification region on the base substrate.

In some embodiments, the display substrate further includes:

a light shielding layer between the fingerprint identification module and the light emitting unit, wherein a second via is formed in the light shielding layer; and an orthographic projection of the second via on the base substrate overlaps an orthographic projection of the fingerprint identification module on the base substrate.

In some embodiments, the fingerprint identification module is on a side of the base substrate away from the light emitting unit.

In a second aspect, an embodiment of the present disclosure further provides a display apparatus, including the display substrate as according to the above first aspect.

In a third aspect, an embodiment of the present disclosure further provide a method for manufacturing a display substrate, which may be used to manufacture the display substrate according to the first aspect, wherein the method includes:

providing a base substrate;

forming a plurality of pixels on a side of the base substrate, wherein each of the plurality of pixels includes at least one light emitting unit; and forming an antireflection structure on a side of the light emitting unit away from the base substrate, wherein the antireflection structure is divided into antireflection regions and transmission region in addition to the antireflection regions, an orthographic projection of the antireflection region on the base substrate does not overlap an orthographic projection of the light emitting unit on the base substrate, the antireflection region is configured to reduce light reflectivity of light incident from a side of the antireflection structure away from the base substrate and allow a part of light irradiating the antireflection region to be transmitted, and the transmission region of the antireflection structure is configured to allow at least a part of light irradiating the transmission region to be transmitted.

BRIEF DESCRIPTION OF DRAWINGS

FIG. 33 is a flowchart of a method for manufacturing a display substrate according to an embodiment of the present disclosure.

DETAIL DESCRIPTION OF EMBODIMENTS

In order to make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are some, but not all, embodiments of the present disclosure. Further, the embodiments and features of the embodiments in the present disclosure may be combined with each other without conflict. All other embodiments, which can be derived by one of ordinary skill in the art from the described embodiments of the present disclosure without creative efforts, are within the protection scope of the present disclosure.

Unless otherwise defined, a technical or scientific term used herein shall have the ordinary meaning as understood by one of ordinary skill in the art to which the present disclosure belongs. The terms "first", "second", and the like, as used in the present disclosure, do not denote any order, quantity, or importance, but rather are used to distinguish one element from another. The word "comprising" or "comprises", or the like, means that the element or item appearing in front of the word "comprising" or "comprises" includes the element or item listed after the word "comprising" or "comprises" and its equivalents, and does not exclude other elements or items. The term "connected" or "coupled" or the like is not restricted to a physical or mechanical connection, but may include an electrical connection, whether direct or indirect.

Figure 1:
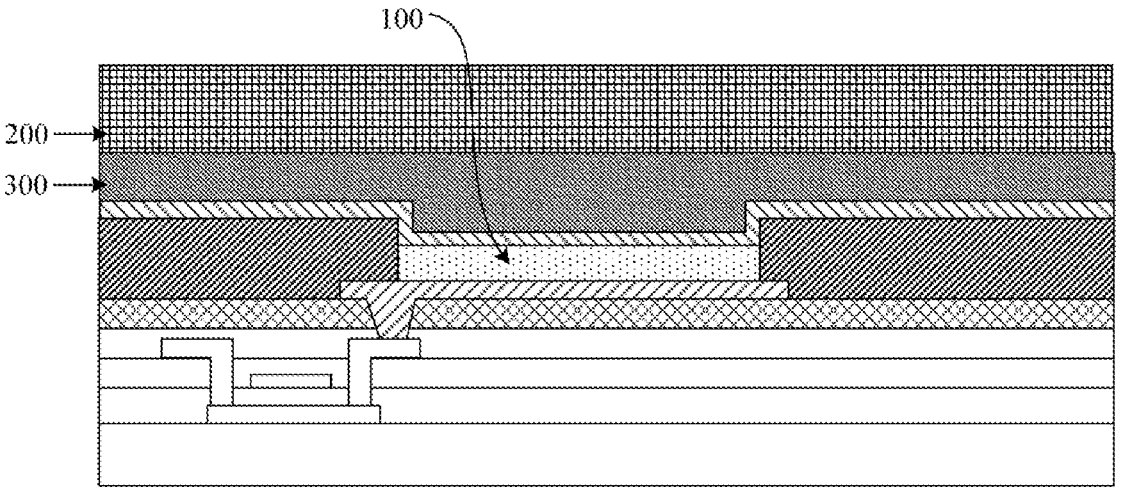
FIG. 1 is a schematic sectional view of a display substrate in the related art.

FIG. 1 is a schematic sectional view of a display substrate in the related art. As shown in FIG. 1, in the related art, in order to effectively reduce a light reflectivity of the OLED display substrate under strong light intensity, a polarizer (POL) 200 is generally arranged on a light emitting side of an OLED 100 to achieve an effect of reducing the light reflectivity to ambient light. However, an arrangement of the polarizer 200 may cause the OLED 100 to have serious light loss; meanwhile, since the polarizer 100 has a relatively great thickness and needs to be fixed by the adhesive 300, an overall thickness of the display substrate is relatively great; meanwhile, the polarizer 200 is brittle, which is not favorable for development of bendable products.

Figure 2:
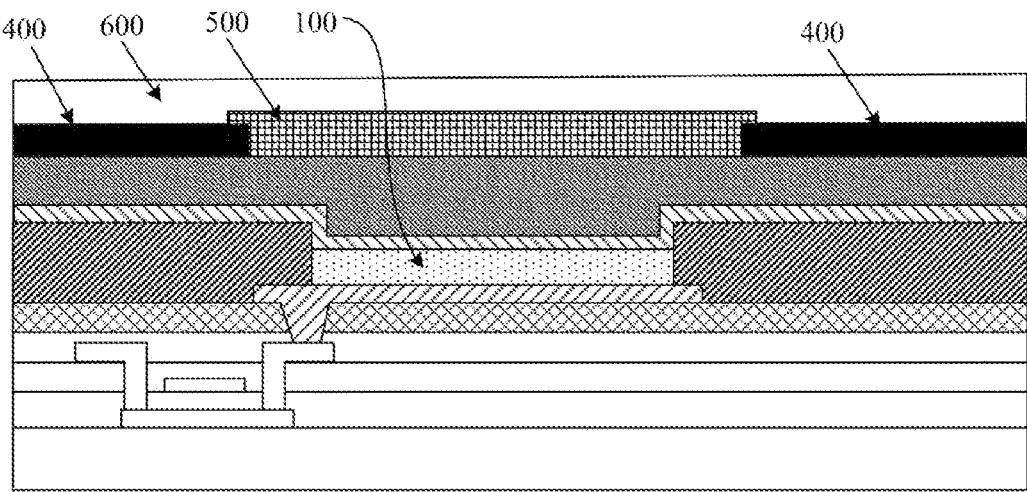
FIG. 2 is a schematic sectional view of a display substrate in the related art.

FIG. 2 is another schematic sectional view of a display substrate in the related art. As shown in FIG. 2, in the related art, a display substrate based on a technology of Color Filter on Encapsulation (COE) is provided. A color filter (including a black matrix 400 and a color filter pattern 500) is used instead of a polarizer, and a protective layer 600 is arranged on a side of the color filter away from a base substrate, and this technology belongs to a polarizer-less (POL-less) technology. The black matrix 400 can effectively absorb light to reduce the light reflectivity; meanwhile, a thickness of the color filter is relatively low, so that the overall thickness of the display panel can be effectively reduced. However, due to an existence of the black matrix 400, only a region where the OLED 100 is located can transmit light to achieve display, and the other region covered by the black matrix 400 does not transmit light, which makes the display substrate incompatible with optical sensing function (e.g., optical fingerprint identification function).

In order to effectively solve at least one technical problem existing in the related art, the present disclosure provides a corresponding solution. The technical solutions of the present disclosure will be described in detail with reference to specific embodiments.

Figure 3:
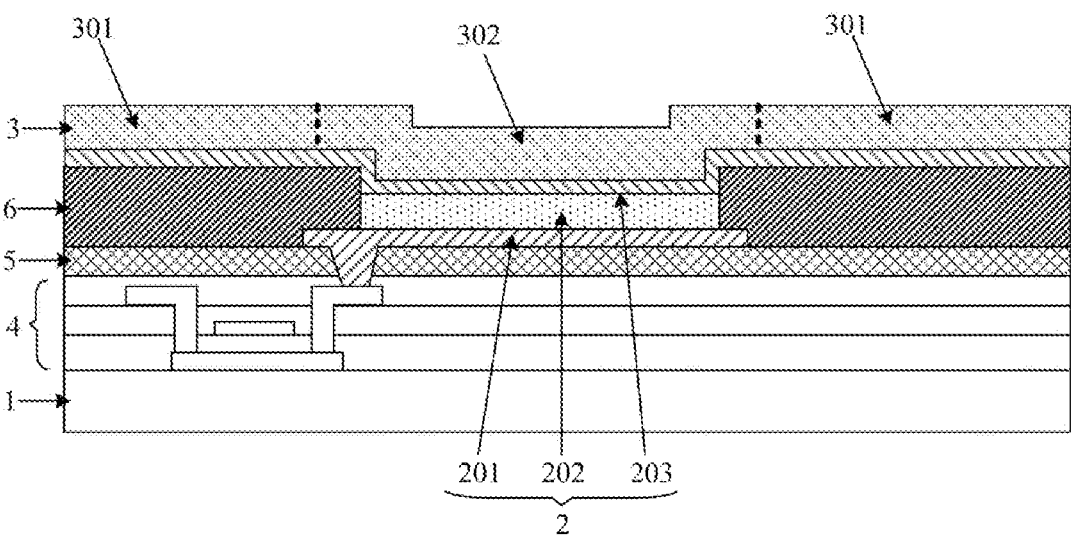
FIG. 3 is a schematic sectional view of a partial region of a display substrate according to an embodiment of the present disclosure.

FIG. 3 is a schematic sectional view of a partial region of a display substrate according to an embodiment of the present disclosure. As shown in FIG. 3, the display substrate includes a base substrate, a plurality of pixels and an antireflection structure.

The base substrate 1 may be a rigid substrate 1 (e.g., a glass substrate 1) or a flexible substrate 1 (e.g., a polyimide substrate 1).

The pixels are located on one side of the base substrate 1, each pixel includes at least one light emitting unit 2, and the light emitting unit 2 can generate and emit light.

In an embodiment of the present disclosure, the light emitting unit is a unit or a structure capable of generating and emitting light, such as an Organic Light Emitting Diode (OLED), a Quantum dot Light Emitting Diode (QLED), or the like.

In some embodiments, the light emitting unit 2 may be an Organic Light Emitting Diode (OLED) including a cathode 203, an anode 201 and an organic functional layer 202 located between the cathode 203 and the anode 201. The organic functional layer 202 at least includes an organic light emitting layer, and alternative functional film layers such as a hole transport layer, a hole blocking layer, an electron transport layer, and an electron blocking layer may be further provided according to practical requirements. In general, each light emitting unit 2 is configured with a corresponding driving circuit (located in a driving layer 4), the driving circuit includes a driving transistor (which may be a low temperature poly-silicon type transistor or an oxide type transistor), and the driving circuit is electrically connected to the corresponding light emitting unit 2 to drive the light emitting unit 2 to emit light. In some embodiments, the light generated by the light emitting unit 2 is white light. Alternatively, a color of the light generated by a respective light emitting unit 2 may be designed individually according to practical requirements. For example, a part of the light emitting units 2 emit red light, a part of the light emitting units 2 emit green light, and the remaining part of the light emitting units 2 emit blue light.

It should be noted that, in some embodiments, a planarization layer 5 is arranged between the anode 201 and the driving layer 4, and the anode 201 is connected to a drain of the corresponding driving transistor through a via in the planarization layer 5.

An antireflection structure 3 is located on a side of the light emitting unit 2 away from the base substrate 1. The antireflection structure 3 is divided into antireflection regions 301, and an orthographic projection of the antireflection region 301 on the base substrate 1 does not overlap an orthographic projection of the light emitting unit 2 on the base substrate 1. The antireflection region 301 of the antireflection structure 3 is configured to reduce light reflectivity of light incident from a side of the antireflection structure 3 away from the base substrate 1, and to allow light transmission of a part of light irradiating the antireflection region 301.

In some embodiments, the antireflection structure 3 further includes transmission regions 302 in addition to the antireflection regions 301. The transmission region 302 of the antireflection structure 3 is configured to allow at least a part of light irradiating the transmission region 302 to be transmitted In an embodiment of the present disclosure, the orthographic projection of the antireflection region 301 on the base substrate 1 and the orthographic projection of the light emitting unit 2 on the base substrate 1 do not overlap, that is, an orthographic projection of the transmission region 302 on the base substrate 1 may cover the orthographic projection of the light emitting unit 2 on the base substrate 1. In this case, light emitted by the light emitting unit 2 and irradiating the antireflection region 301 of the antireflection structure 3 may be transmitted, which is beneficial to reducing the light loss of the light emitting unit 2 and improving the display quality of the product. Meanwhile, the antireflection region 301 of the antireflection structure 3 has a certain light transmittance while having a function of reducing the light reflectivity, so that the display substrate can be compatible with an optical sensing function, which will be described in detail with reference to specific embodiments later.

In some embodiments, the display substrate further includes a pixel defining layer 6, which is located on one side of the base substrate 1. A plurality of accommodating holes in a one-to-one correspondence with the light emitting units 2 are formed in the pixel defining layer 6, and the light emitting units 2 are located in the corresponding accommodating holes, respectively.

Figure 4A:
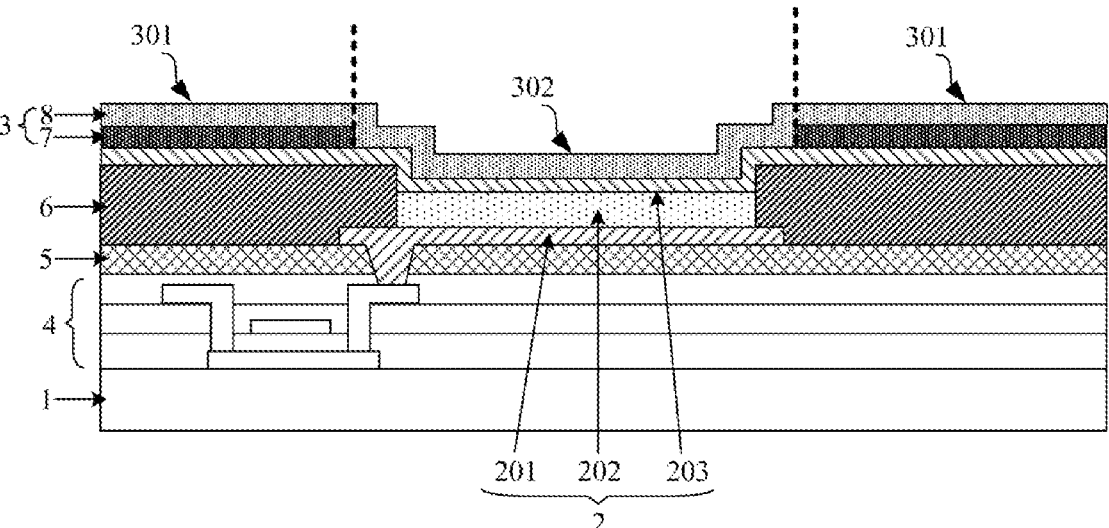
FIG. 4A is another schematic sectional view of a partial region of a display substrate according to an embodiment of the present disclosure.
Figure 4B:
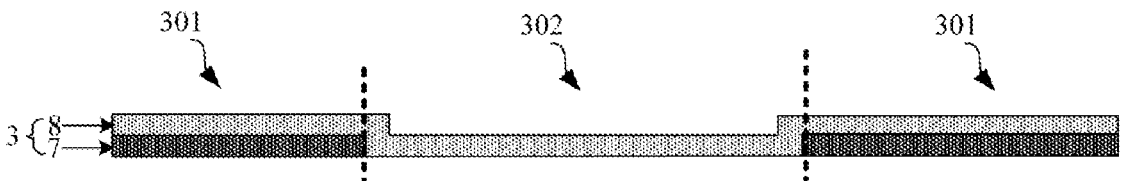
FIG. 4B is a schematic sectional view of an antireflection structure in FIG. 4A.

FIG. 4A is another schematic sectional view of a partial region of a display substrate according to an embodiment of the present disclosure, and FIG. 4B is a schematic sectional view of the antireflection structure 3 in FIG. 4A. As shown in FIGS. 4A and 4B, the antireflection structure 3 includes a transflective layer 7 and a first dielectric layer 8. The transflective layer 7 is formed with a first via in the transmission region 302 (a position, where the first via is located, is in the transmission region 302). The first dielectric layer 8 is at least located in the antireflection region 301 (FIGS. 4A and 4B exemplarily show that the first dielectric layer 8 is located in not only the antireflection region 301 but also the transmission region 302), and the first dielectric layer 8 is located on a side of the transflective layer 7 away from the base substrate 1 and is in contact with a surface of the transflective layer 7 away from the base substrate 1. The first dielectric layer 8 is configured such that: light is incident into the first dielectric layer 8 from the side of the first dielectric layer 8 away from the base substrate 1 and is reflected at the transflective layer 7, when first reflected light formed by the light reflected at the transflective layer returns to a surface of the first dielectric layer 8 away from the base substrate 1, destructive interference between the first reflected light and second reflected light occurs, wherein the second reflected light is formed by reflection of light at the surface of the first dielectric layer 8 away from the base substrate 1.

Figure 5:
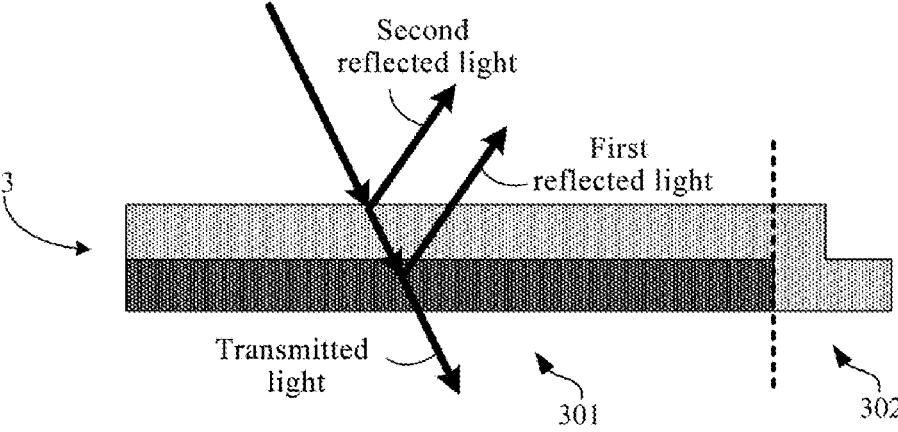
FIG. 5 is a schematic diagram illustrating how to reduce light reflectivity of light incident from a side of an antireflection structure away from a base substrate and have light transmissivity in an antireflection region of the antireflection structure according to an embodiment of the present disclosure.

FIG. 5 is a schematic diagram illustrating how to reduce light reflectivity of light incident from a side of an antireflection structure away from a base substrate and have light transmittivity in the antireflection region of the antireflection structure according to an embodiment of the present disclosure. As shown in FIG. 5, when light irradiates the surface of the first dielectric layer 8 away from the base substrate 1 from the side of the antireflection structure 3 away from the base substrate 1, a part of the light is reflected at the surface of the first dielectric layer 8 away from the base substrate 1 to form the second reflected light, and the other part of the light is incident into the first dielectric layer 8. When light incident into the first dielectric layer 8 reaches the transflective layer 7, a part of the light is reflected to form the first reflected light, and a part of the light is transmitted through the transflective layer 7 (the antireflection region 301 has a certain light transmittance). When the first reflected light reaches the surface of the first dielectric layer 8 away from the base substrate 1, destructive interference between the first reflected light and the second reflected light occurs, so that the effect of reducing the light reflectivity of light from the side of the antireflection structure 3 away from the base substrate 1 is achieved.

As can be seen from FIG. 5, the transflective layer 7 and the first dielectric layer 8 can make the antireflection region 301 of the antireflection structure 3 have a reduced light reflectivity for light incident from the side of the antireflection structure 3 away from the base substrate 1, and make a part of light irradiating the antireflection region 301 be transmitted.

In practical applications, a thickness of the first dielectric layer 8 may be correspondingly designed according to parameters such as a structure and a material of the first dielectric layer 8, as long as destructive interference between the first reflected light and the second reflected light occurs at the surface of the first dielectric layer 8 away from the base substrate 1.

Based on the foregoing content, the antireflection structure in an embodiment of the present disclosure is a transflective structure as a whole. Based on the reversibility of light, the light reflectivity of the transflective structure for the light incident from the side away from the base substrate 1 is equal to a light reflectivity for light incident from a side close to the base substrate 1, and the light transmittance of the transflective structure for the light incident from the side away from the base substrate 1 is equal to a light transmittance of the light incident from the side close to the base substrate 1.

By arranging the first dielectric layer 8 on the side of the transflective layer 7 away from the base substrate 1, the first dielectric layer 8 can play a role in reducing the light reflectivity on the side of the transflective layer 7 away from the base substrate. In a case where a light absorption rate of the transflective layer is constant, the lower the light reflectivity is, the greater the light transmittance is. Therefore, by arranging the first dielectric layer 8 on the side of the transflective layer 7 away from the base substrate 1, not only the light reflectivity of light incident from the side of the antireflection structure away from the base substrate can be reduced, but also the light transmittance of the whole antireflection structure can be effectively improved.

Figure 6:
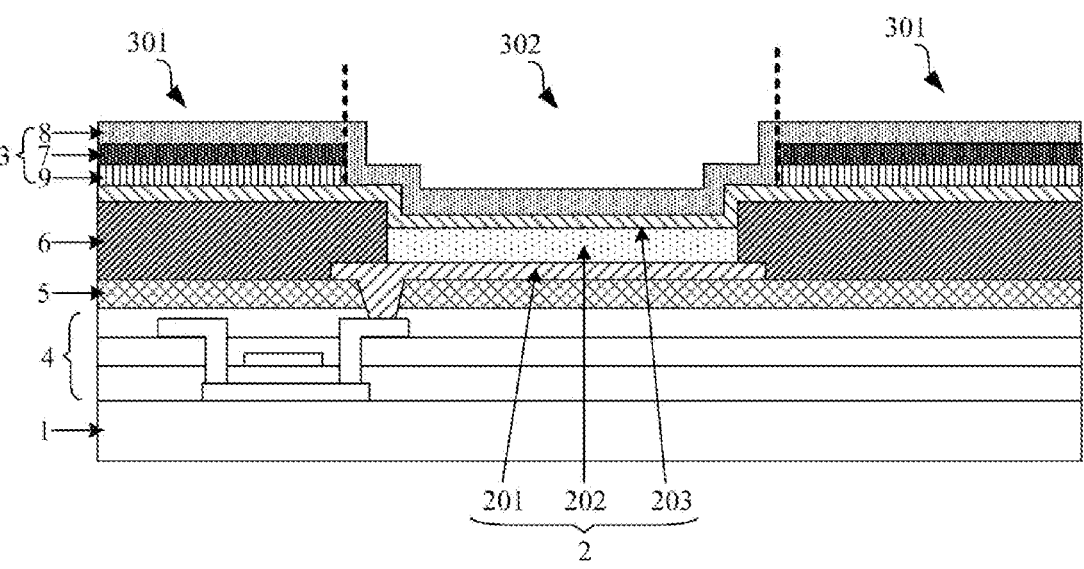
FIG. 6 is another schematic sectional view of a partial region of a display substrate according to an embodiment of the present disclosure.
Figure 7:
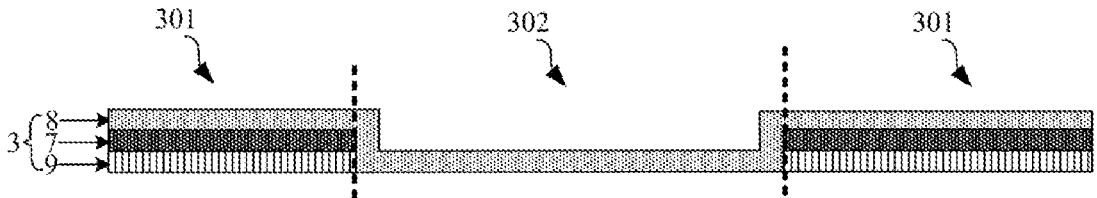
FIG. 7 is a schematic sectional view of an antireflection structure in FIG. 6.

FIG. 6 is another schematic sectional view of a partial region of a display substrate according to an embodiment of the present disclosure, and FIG. 7 is a schematic sectional view of the antireflection structure in FIG. 6. As shown in FIGS. 6 and 7, in some embodiments, the antireflection structure 3 includes not only the transflective layer 7 and the first dielectric layer 8, but also a second dielectric layer 9, which will be described in detail below.

The second dielectric layer 9 is at least located in the antireflection region 301 (FIGS. 6 and 7 exemplarily show that the second dielectric layer 9 is located only in the antireflection region 301), and the second dielectric layer 9 is located on a side of the transflective layer 7 close to the base substrate 1 and is in contact with a surface of the transflective layer 7 close to the base substrate 1. The second dielectric layer 9 is configured such that: light is incident into the second dielectric layer 9 from a side of the second dielectric layer 9 close to the base substrate 1 and is reflected at the transflective layer 7, when third reflected light formed by the light reflected at the transflective layer 7 returns to a surface of the second dielectric layer 9 close to the base substrate 1, destructive interference between the third reflected light and fourth reflected light occurs, wherein the fourth reflected light is formed by light reflected at the surface of the second dielectric layer 9 close to the base substrate 1.

Figure 8:
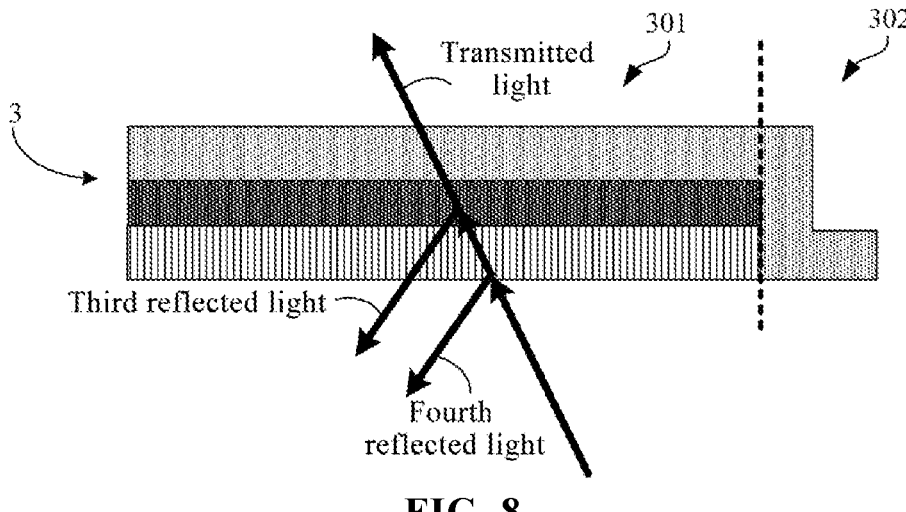
FIG. 8 is a schematic diagram illustrating how to reduce light reflectivity of a light incident from a side of an antireflection structure close to a base substrate in an antireflection region of the antireflection structure according to an embodiment of the present disclosure.

FIG. 8 is a schematic diagram illustrating a principle how reducing a light reflectivity of a light incident from a side of an antireflection structure close to a base substrate is achieved in an antireflection region of the antireflection structure according to an embodiment of the present disclosure. As shown in FIG. 8, when light irradiates the surface of the second dielectric layer 9 close to the base substrate 1 from the side of the antireflection structure 3 close to the base substrate 1, a part of the light is reflected at the surface of the second dielectric layer 9 close to the base substrate 1 to form the fourth reflected light, and the other part of the light is incident into the second dielectric layer 9. When the light incident into the second dielectric layer 9 reaches the transflective layer 7, a part of the light is reflected to form the third reflected light, and a part of the light is transmitted through the transflective layer 7 (the antireflection region 301 has a certain light transmittance). When the third reflected light reaches the surface of the second dielectric layer 9 close to the base substrate 1, destructive interference between the third reflected light and the fourth reflected light occurs, so that the effect of reducing the light reflectivity of the light from the side of the antireflection structure 3 close to the base substrate 1 is achieved.

The antireflection structure in an embodiment of the present disclosure is a transflective structure as a whole. By arranging the second dielectric layer 9 on the side of the transflective layer 7 close to the base substrate 1, the second dielectric layer 9 can play a role in reducing the light reflectivity on the side of the transflective layer 7 close to the base substrate. In a case where a light absorption rate of the transflective layer is constant, the lower the light reflectivity is, the greater the light transmittance is. Therefore, by arranging the second dielectric layer 9 on the side of the transflective layer 7 close to the base substrate 1, not only the light reflectivity of the light incident from the side of the antireflection structure close to the base substrate can be reduced, but also the light transmittance of the light incident from the side of the antireflection structure close to the base substrate can be effectively improved. Based on the reversibility of light, light on the side of the antireflection structure away from the base substrate also shows higher light transmittance when sequentially passing through the transflective layer 7 and the second dielectric layer 9. Therefore, in the embodiment of the present disclosure, a light transmittance of the whole antireflection structure can be further improved by providing the second dielectric layer 9.

In practical application, a thickness of the second dielectric layer 9 may be correspondingly designed according to parameters such as a structure and a material of the second dielectric layer 9, as long as destructive interference the third reflected light and the fourth reflected light occurs at the surface of the first dielectric layer 8 away from the base substrate 1.

It should be noted that in the embodiments of the present disclosure, the first dielectric layer 8, the transflective layer 7, and the second dielectric layer 9 may be directly formed on the substrate based on a thin film deposition process, so that the first dielectric layer 8, the transflective layer 7, and the second dielectric layer 9 are each formed relatively thin, and the whole antireflection structure 3 is also formed relatively thin, which is beneficial to thinning the display substrate.

Figure 9:
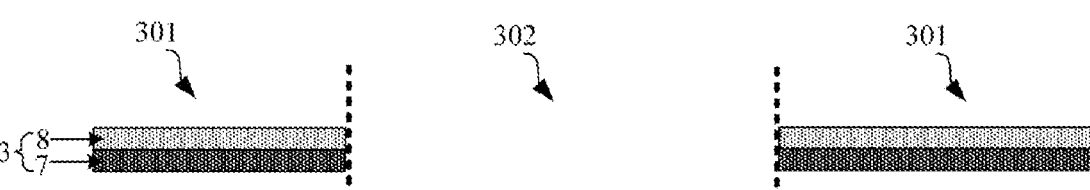
FIG. 9 is a schematic sectional view of an antireflection structure in an embodiment of the present disclosure.

FIG. 9 is a schematic sectional view of an antireflection structure in an embodiment of the present disclosure. As shown in FIG. 9, FIG. 9 illustrates a case where the antireflection structure 3 includes a first dielectric layer 8 and a transflective layer 7, and the first dielectric layer 8 is only located in the antireflection region 301 and not located in the transmission region 302.

Figure 10:
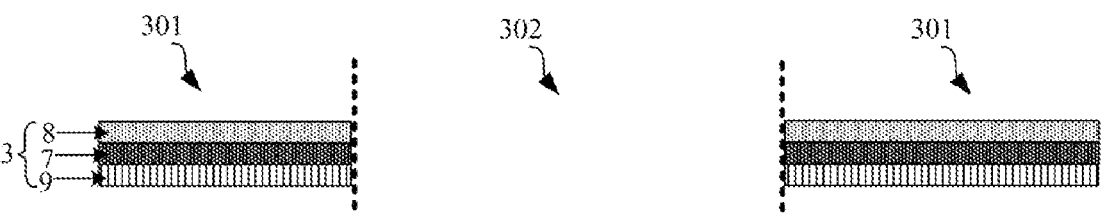
FIG. 10 is another schematic sectional view of an antireflection structure in an embodiment of the present disclosure.

FIG. 10 is another schematic sectional view of an antireflection structure in an embodiment of the present disclosure. As shown in FIG. 10, FIG. 10 illustrates a case where the antireflection structure 3 includes a first dielectric layer 8, a transflective layer 7, and a second dielectric layer 9, the first dielectric layer 8 is only located in the antireflection region 301 but not located in the transmission region 302, and the second dielectric layer 9 is only located in the antireflection region 301 but not located in the transmission region 302.

It should be noted that, in the cases shown in FIGS. 9 and 10, the antireflection structure 3 is a hollow structure in the transmission region 302.

Figure 11:
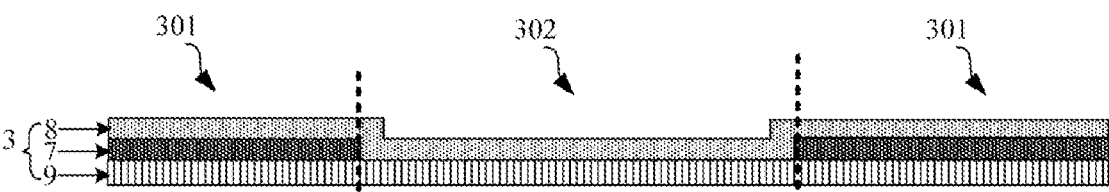
FIG. 11 is another schematic sectional view of an antireflection structure in an embodiment of the present disclosure.

FIG. 11 is another schematic sectional view of an antireflection structure in an embodiment of the present disclosure. As shown in FIG. 11, FIG. 11 illustrates a case where the antireflection structure 3 includes a first dielectric layer 8, a transflective layer 7, and a second dielectric layer 9, the first dielectric layer 8 is located in not only the antireflection region 301 but also the transmission region 302, and the second dielectric layer 9 is located in not only the antireflection region 301 but also the transmission region 302.

Figure 12:
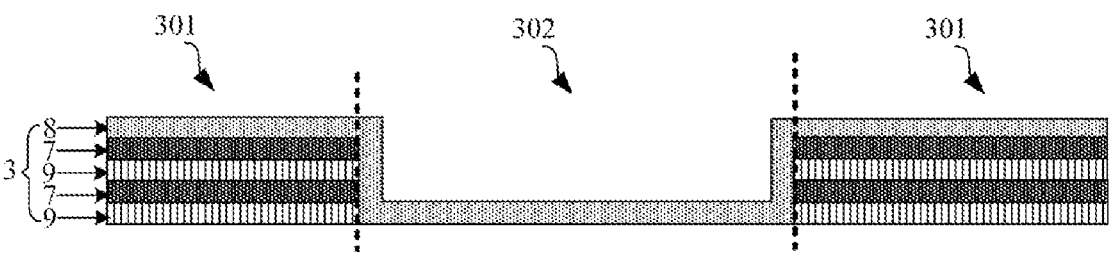
FIG. 12 is another schematic sectional view of an antireflection structure in an embodiment of the present disclosure.

FIG. 12 is another schematic sectional view of an antireflection structure in an embodiment of the present disclosure. As shown in FIG. 12, FIG. 12 illustrates a case where the antireflection structure 3 includes a first dielectric layer 8, N numbers of transflective layers 7, and N numbers of second dielectric layers 9, where N is greater than or equal to 2 and N is an integer. The second dielectric layers 9 and the transflective layers 7 are sequentially and alternately arranged along a direction away from the base substrate 1, and the first dielectric layer 8 is located on a side of a transflective layer 7 farthest from the base substrate 1, away from the base substrate 1, and is in contact with the surface of the transflective layer 7 farthest from the base substrate 1, away from the base substrate 1.

It should be noted that FIG. 12 only schematically illustrates a case where the antireflection structure 3 includes one first dielectric layer 8, two transflective layers 7, and two second dielectric layers 9 (i.e., a case where N=2), which case is for an exemplary purpose only.

In the antireflection structure 3 shown in FIG. 12, the light reflectivity of the antireflection region 301 of the antireflection structure 3 for the light incident from the side of the antireflection structure 3 away from the base substrate 1 is mainly determined by the optical characteristics of the first dielectric layer 8 and the transflective layer 7 farthest from the base substrate 1 (in contact with the first dielectric layer 8). It should be noted that the transflective layers 7 except the transflective layer 7 farthest from the base substrate 1 and each of the second dielectric layers 9 also have a certain influence on the light reflectivity of the light incident from the side of the antireflection structure 3 away from the base substrate 1, but these layers have relatively little influence on the light reflectivity of the light incident from the side of the antireflection structure 3 away from the base substrate 1.

In the antireflection structure 3 shown in FIG. 12, the light reflectivity of the antireflection region 301 of the antireflection structure 3 for the light incident from a side of the antireflection structure 3 close to the base substrate 1 is mainly determined by the optical characteristics of the second dielectric layer 9 closest to the base substrate 1 and the transflective layer 7 closest to the base substrate 1 (in contact with a surface of the second dielectric layer 9 closest to the base substrate 1, away from the base substrate 1). It should be noted that the transflective layers 7 except the transflective layer 7 closest to the base substrate 1, the second dielectric layers 9 except the second dielectric layer 9 closest to the base substrate 1, and the first dielectric layer 8 also have a certain influence on the light reflectivity of the light incident from the antireflection structure 3 close to the base substrate 1, but these layers have relatively small influence on the light reflectivity of the light incident from the antireflection structure 3 close to the base substrate 1.

In practical application, the number of the transflective layers 7 and the number of the second dielectric layers 9, a thickness of each transflective layer 7 and a thickness of each second dielectric layer 9 may be correspondingly designed according to practical requirements, so that adjusting the light reflectivity and the light transmittance on both sides of the antireflection structure 3 can be achieved.

It should be noted that, in the embodiments of the present disclosure, whether the first dielectric layer 8/the second dielectric layer 9 are formed in the transmission region may be selectively designed according to practical requirements, which is not limited by the present disclosure.

In some embodiments, where the first dielectric layer 8 is located in not only the antireflection region 301 but also the transmission region 302 (for example, as shown in FIGS. 4B, 7, 11, and 12), the first dielectric layer 8 may be multiplexed as a light extraction layer, and the light extraction layer can achieve light extraction through refractive index matching, which is beneficial to improving the light extraction rate of the light emitting unit 2. In the embodiment of the present disclosure, the first dielectric layer 8 multiplexed as the light extraction layer may have a single-layer structure, a double-layer structure, or a multi-layer structure. A specific structure of the first dielectric layer 8 is not limited in the technical solution of the present disclosure.

In some embodiments, the first dielectric layer 8 multiplexed as the light extraction layer has a single-layer structure, and the refractive index of the first dielectric layer 8 is in a range of 1.35 to 2.0. The first dielectric layer 8 may be made of an organic material (e.g., a transparent resin material) or an inorganic material (e.g., silicon oxide).

In addition, where the second dielectric layer 9 is located in not only the antireflection region 301 but also the transmission region 302, the second dielectric layer 9 may be made of a material having a relatively high optical transmittance.

In some embodiments, the material of the second dielectric layer 9 may include a transparent conductive material. Alternatively, the transparent conductive material includes at least one of aluminum zinc oxide (AZO) and zinc indium oxide (IZO).

In some embodiments, the material of the transflective layer 7 includes a metal material. Alternatively, the metal material includes at least one of titanium (Ti), magnesium (Mg), aluminum (Al), silver (Ag) and niobium (Nb). The transflective layer 7 made of a metal material not only has a better light reflectivity (beneficial to achievement of the destructive interference and improvement of the antireflection effect), but also has a better light transmittivity (ensuring that the antireflection region 301 has a certain light transmittance).

In some embodiments, the second dielectric layer 9 closest to the base substrate 1 is in contact with one electrode of the light emitting unit 2 away from the base substrate 1 (the cathode 203 of the light emitting unit 2). In this case, the second dielectric layer 9 is made of a transparent conductive material, so that the second dielectric layer 9 and the cathode 203 are connected together in parallel, which can effectively reduce an equivalent resistance at the cathode 203 and is beneficial to the transmission of signals in the cathode 203. Further, where the transflective layer 7 is made of a metal material, the metal material has a certain conductivity, so that the transflective layer 7 is connected to and in parallel with the cathode 203 of the light emitting unit 2 through the second dielectric layer 9, and the equivalent resistance at the cathode 203 can be further reduced.

In the following description, for convenience of description, a side of the antireflection structure 3 close to the first dielectric layer 8 is referred to as a first side of the antireflection structure 3 (i.e., an upper side of the antireflection structure 3 in FIGS. 4B, 7, 9 to 12), and a side opposite to the first side is referred to as a second side of the antireflection structure 3 (i.e., a lower side of the antireflection structure 3 in FIGS. 4B, 7, 9 to 12).

As a specific example, the antireflection structure 3 includes a first dielectric layer 8, a transflective layer 7 and a second dielectric layer 9, the first dielectric layer 8 is made of silicon oxide (SiOx) and has a thickness of 80 nm, the transflective layer 7 is made of titanium and has a thickness of 5 nm, and the second dielectric layer 9 is made of indium zinc oxide and has a thickness of 14 nm. It is found through optical tests that the light reflectivity of the antireflection structure 3 for visible light from the first side is about 3%, the light reflectivity of the antireflection structure 3 for visible light from the second side is about 3% (that is, a total light reflectivity of the antireflection structure 3 for visible light is about 3%), the light transmittance of the antireflection structure 3 for the visible light from the first side is about 58%, and the light transmittance of the antireflection structure 3 for the visible light from the second side is about 58% (that is, a total light transmittance of the antireflection structure 3 for visible light is about 58%).

As another specific example, the antireflection structure 3 includes one first dielectric layer 8, two transflective layers 7, and two second dielectric layers 9, the first dielectric layer 8 is made of silicon oxide (SiOx) and has a thickness of 80 nm, the transflective layers 7 are made of titanium and each have a thickness of 4 nm, the second dielectric layers 9 are made of indium zinc oxide and each have a thickness of 70 nm. It is found through optical tests that the light reflectivity of the antireflection structure 3 for visible light from the first side is about 3.5%, the light reflectivity of the antireflection structure 3 for visible light from the second side is about 3.5% (that is, a total light reflectivity of the antireflection structure 3 for visible light is about 3.5%), the light transmittance of the antireflection structure 3 for the visible light from the first side is about 46%, and the light transmittance of the antireflection structure 3 for the visible light from the second side is about 46% (that is, a total light transmittance of the antireflection structure 3 for visible light is about 46%).

Figure 13:
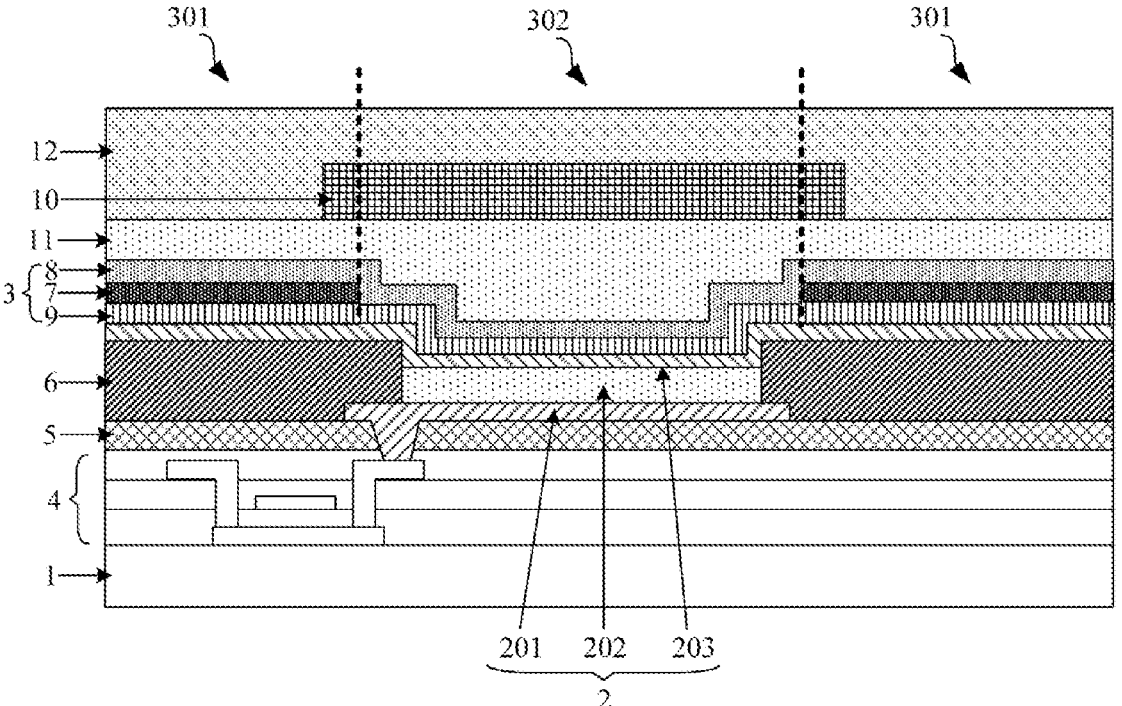
FIG. 13 is another schematic sectional view of a partial region of a display substrate according to an embodiment of the present disclosure.

FIG. 13 is another schematic sectional view of a partial region of a display substrate according to an embodiment of the present disclosure. As shown in FIG. 13, in some embodiments, the display substrate further includes a color filter layer (also referred to as a color filter) on a side of the light emitting unit 2 away from the base substrate 1. The color filter layer includes a plurality of color filter patterns 10 in a one-to-one correspondence with the light emitting units 2, and an orthographic projection of the color filter pattern 10 on the base substrate 1 covers an orthographic projection of the light emitting unit 2 corresponding to the color filter pattern 10 on the base substrate 1.

The color filter pattern 10 not only filters light emitted by the light emitting unit 2, but also filters external ambient light. However, the greater a thickness of the color filter pattern 10 is, the better a filter effect of the color filter pattern 10 for the external ambient light is, but the lower a light transmittance for the light emitted by the light emitting unit 2 is. The thickness of the color filter pattern 10 is about 5 μm in order to balance the filtering effect of the color filter pattern 10 for the external ambient light and the light transmittance for the light emitted by the light emitting unit 2. As a specific application, each pixel of the display substrate includes a red sub-pixel, a green sub-pixel, and a blue sub-pixel, and the color filter pattern 10 corresponding to the light emitting unit 2 in the red sub-pixel is a red filter pattern (only allowing red light to pass through), the color filter pattern 10 corresponding to the light emitting unit 2 in the green sub-pixel is a green filter pattern (only allowing green light to pass through), and the color filter pattern 10 corresponding to the light emitting unit 2 in the blue sub-pixel is a blue filter pattern (only allowing blue light to pass through).

In some embodiments, the display substrate further includes an encapsulation structure 11, which is located between the light emitting unit 2 and the color filter layer. Generally, the encapsulation structure 11 includes inorganic encapsulation layers and organic encapsulation layers, which are alternately arranged, for example, has a three-layer laminated structure consisting of an inorganic encapsulation layer, an organic encapsulation layer, and an inorganic encapsulation layer. A specific structure of the encapsulation structure 11 is not limited in the technical solution of the present disclosure.

In some embodiments, the display substrate further includes a protective layer 12, which is located on a side of the color filter layer away from the base substrate 1. In some embodiments, a material of the protective layer 12 may include polyimide or the like.

Referring to FIG. 13, in some embodiments, the antireflection structure 3 is located between the light emitting unit 2 and the encapsulation structure 11. Where the second dielectric layer 9 is included in the antireflection structure 3, the second dielectric layer 9 in the antireflection structure 3 closest to the base substrate 1 may be in direct contact with the cathode 203 of the light emitting unit 2. In this case, as described in the previous embodiment, the second dielectric layer 9 may be made of a transparent conductive material, and the transflective layer 7 may be made of a metal material, so as to achieve the effect of reducing the equivalent resistance at the cathode 203.

It should be noted that, FIG. 13 only exemplifies a case where the structure shown in FIG. 11 is adopted as the antireflection structure 3, which case is for an exemplary purpose only, and does not limit the technical solution of the present disclosure. For the antireflection structure 3 in FIG. 12, the antireflection structure 3 may alternatively adopt any one of the specific structures of the antireflection structure 3 described above in FIGS. 4B, 7, 9, 10, 12, and the like, and details thereof are not repeated here.

Figure 14A:
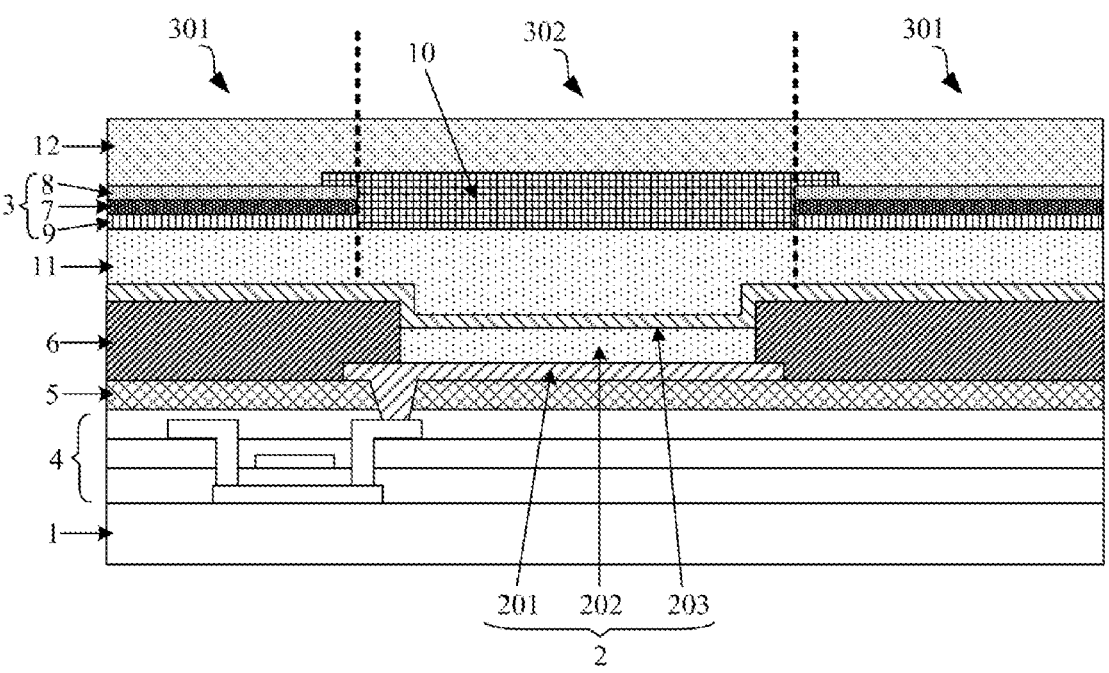
FIG. 14A is another schematic sectional view of a partial region of a display substrate according to an embodiment of the present disclosure.

FIG. 14A is a schematic sectional view of a partial region of a display substrate according to an embodiment of the present disclosure. As shown in FIG. 14A, in the present embodiment, the antireflection structure 3 is located between the encapsulation structure 11 and the protective layer 12.

Referring to FIG. 14A, as an alternative embodiment, the antireflection structure 3 in FIG. 14A adopts the specific structure of the antireflection structure 3 shown in FIG. 10. In this case, the color filter pattern 10 and the antireflection structure 3 are in a same layer, the antireflection structure 3 has a hollow structure in the transmission region 302, and the color filter pattern 10 fills the hollow structure.

Generally, a thickness of the color filter pattern 10 is greater than a thickness of the antireflection structure 3, so that not only does the color filter pattern 10 fill the hollow structure in the antireflection structure 3, but also an edge portion of the color filter pattern 10 covers a part of the surface of the antireflection structure 3 away from the base substrate 1 on the periphery of the hollow structure. In the case shown in FIG. 14A, the thickness of the color filter pattern 10 is greater than the thickness of the antireflection structure 3, and the antireflection structure 3 is located in a region between the color filter patterns 10, so the arrangement of the antireflection structures 3 does not result in an increase of the overall thickness of the display substrate.

It should be noted that, where the antireflection structure 3 has a hollow structure in the transmission region 302, the color filter pattern 10 fills the hollow structure, and the thickness of the color filter pattern 10 is greater than that of the antireflection structure 3, as shown in FIG. 14A, the arrangement of the antireflection structure 3 does not increase the overall thickness of the display substrate.

It should be noted that, FIG. 14A only exemplifies a case where the antireflection structure 3 adopts the structure shown in FIG. 10 and the color filter pattern 10 fills in the hollow structure of the antireflection structure 3, which case is for an exemplary purpose only, and does not limit the technical solution of the present disclosure. In some embodiments, the part of the antireflection structure 3 in the transmission region 302 is not a hollow structure. That is, the first dielectric layer and/or the second dielectric layer includes a part located in the transmission region 302. In this case, the antireflection structure 3 forms a groove in the transmission region 302, a bottom of the groove is a part of the first dielectric layer 8 and/or the second dielectric layer 9 located in the transmission region 302, the groove is filled with the color filter pattern 10, and meanwhile, an edge portion of the color filter pattern 10 covers a part of a surface of the antireflection structure 3 away from the base substrate 1 on the periphery of the groove.

It should be noted that in the embodiment of the present disclosure, where the antireflection structure 3 is located between the encapsulation structure 11 and the protective layer 12, the antireflection structure 3 may adopt any specific structure of the antireflection structure 3 described above as in FIGS. 4B, 7, 9, 11, 12, or the like, and details thereof are not repeated here.

Figure 14B:
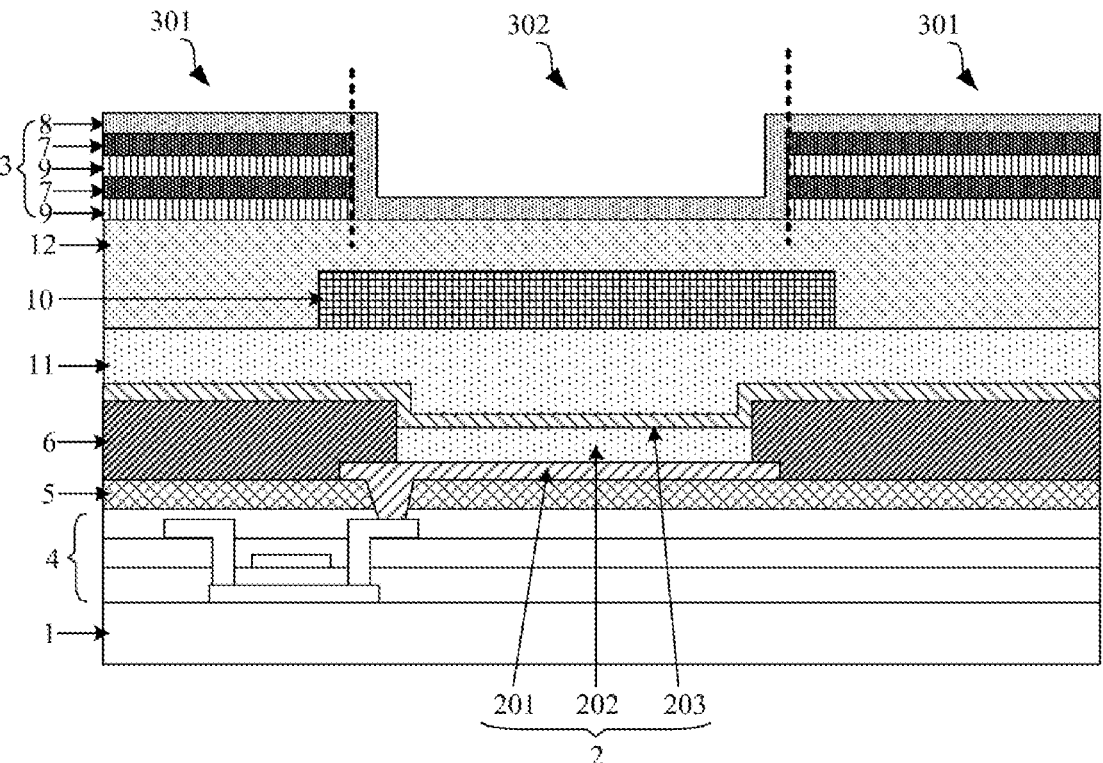
FIG. 14B is another schematic sectional view of a partial region of a display substrate according to an embodiment of the present disclosure.

FIG. 14B is another schematic sectional view of a partial region of a display substrate according to an embodiment of the present disclosure. As shown in FIG. 14B, in the present embodiment, the antireflection structure 3 is located on a side of the protective layer 12 away from the base substrate 1.

It should be noted that FIG. 14B only exemplarily illustrates a case where the antireflection structure 3 adopts the structure shown in FIG. 12, which case is for an exemplary purpose only, and does not limit the technical solution of the present disclosure. For the antireflection structure 3 in FIG. 14B, the antireflection structure 3 may also adopt any one of the specific structures of the antireflection structure 3 described above in FIGS. 4B, 7, 9 to 11, and details thereof is not repeated here.

Figure 15:
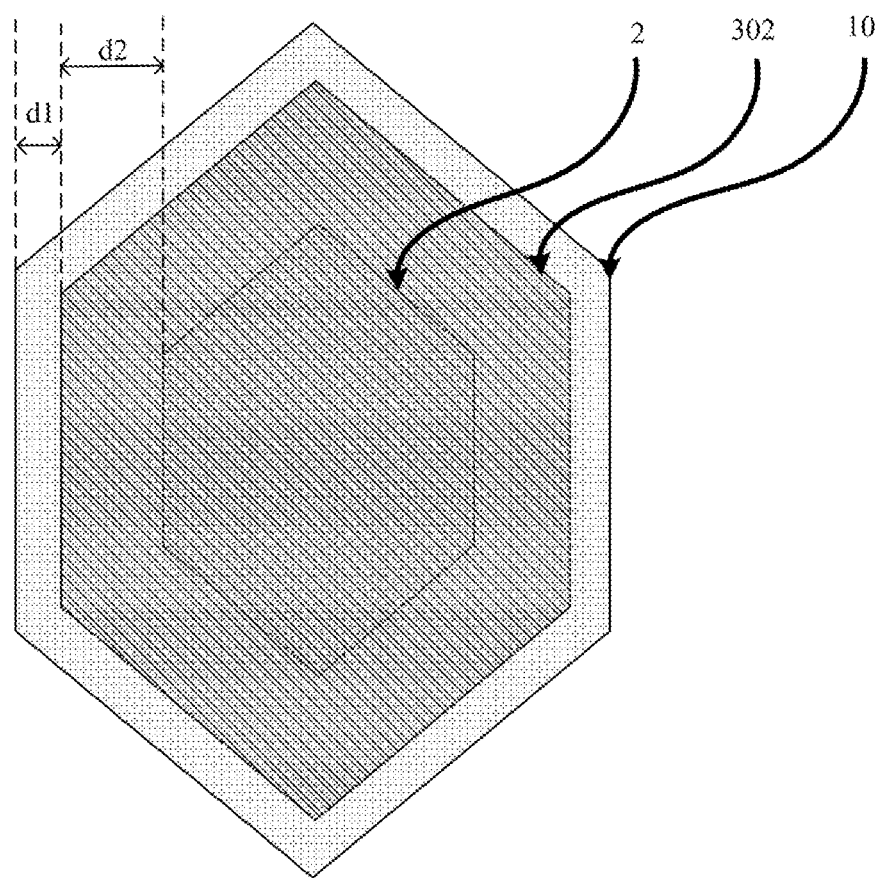
FIG. 15 is a schematic top view of a color filter pattern, a corresponding light transmission region, and a corresponding light emitting unit in an embodiment of the present disclosure.

FIG. 15 is a schematic top view of a color filter pattern, a corresponding transmission region, and a corresponding light emitting unit in an embodiment of the present disclosure. As shown in FIG. 15, in some embodiments, the transmission regions 302 in the antireflection structures 3 are in a one-to-one correspondence with the light emitting units 2. An orthographic projection of the color filter pattern 10 on the base substrate 1 completely covers an orthographic projection of the transmission region 302 corresponding to the color filter pattern 10 on the base substrate 1. The orthographic projection of the transmission region 302 on the base substrate 1 completely covers an orthographic projection of the light emitting unit 2 corresponding to the transmission region 302 on the base substrate 1.

In some embodiments, the orthographic projection of the color filter pattern 10 on the base substrate 1, the orthographic projection of the transmission region 302 corresponding to the color filter pattern 10 on the base substrate 1, and the orthographic projection of the light emitting unit 2 corresponding to the color filter pattern 10 on the base substrate 1 have a same shape.

In some embodiments, a distance between an edge, on one side, of the orthographic projection of the color filter pattern 10 on the base substrate 1 and an edge, on this side, of the orthographic projection of the transmission region 302 corresponding to the color filter pattern 10 on the base substrate 1 is d1; and a distance between an edge, on one side, of the transmission region 302 corresponding to the color filter pattern 10 on the base substrate 1 and an edge, on this side, of the light emitting unit 2 corresponding to the color filter pattern 10 on the base substrate 1 is d2, where d2 is greater than d1.

In some embodiments, d1 is in a range of 1 μm to 3 μm; for example, the distance d1 may be set to 2 μm; and d2 is in range of 3 μm to 7 μm; for example, the distance d2 may be set to 6.5 μm.

It should be noted that, a structure of the layer where the antireflection structure 3 is located is not limited in the technical solution of the present disclosure, as long as it is ensured that the antireflection structure 3 is located on a side of the light emitting unit 2 away from the base substrate 1.

Figure 16:
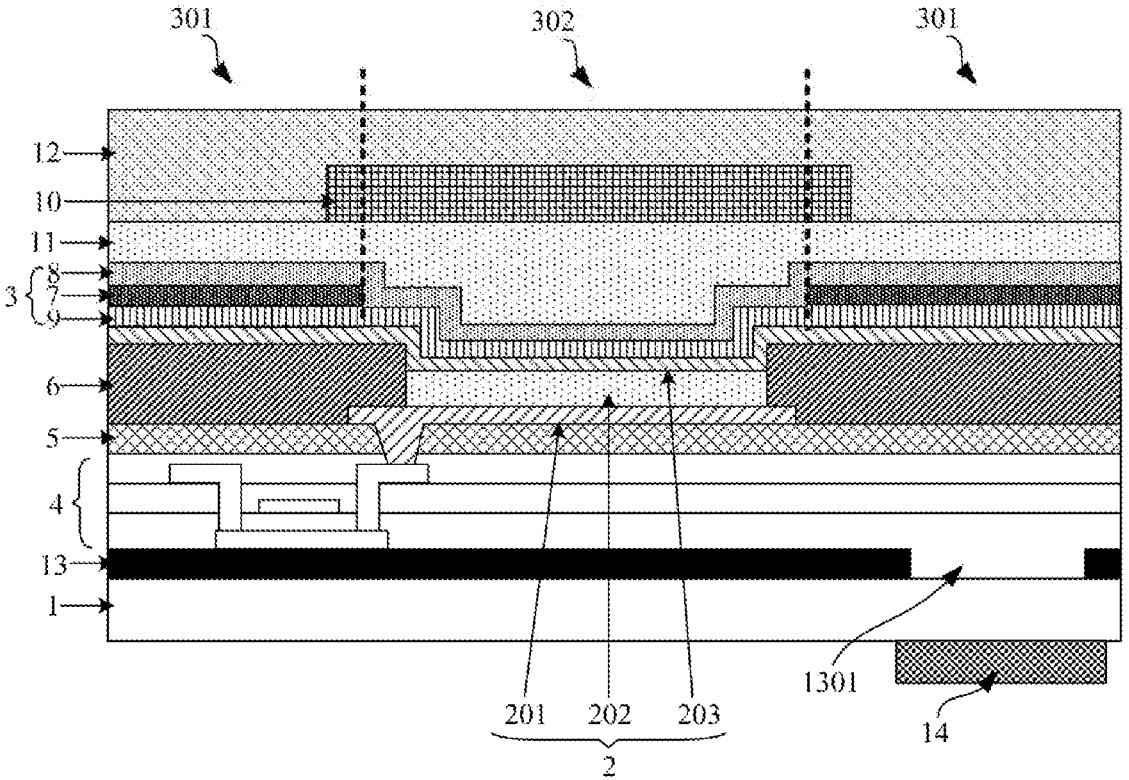
FIG. 16 is another schematic sectional view of a partial region of a display substrate according to an embodiment of the present disclosure.

FIG. 16 is a schematic sectional view of a partial region of a display substrate according to an embodiment of the present disclosure. As shown in FIG. 16, in some embodiments, the display substrate further includes a fingerprint identification module, which is located on a side of light emitting unit 2 close to the base substrate 1, and can be used to perform fingerprint identification. In this case, the display substrate has not only a display function but also a fingerprint identification function.

Figure 17:
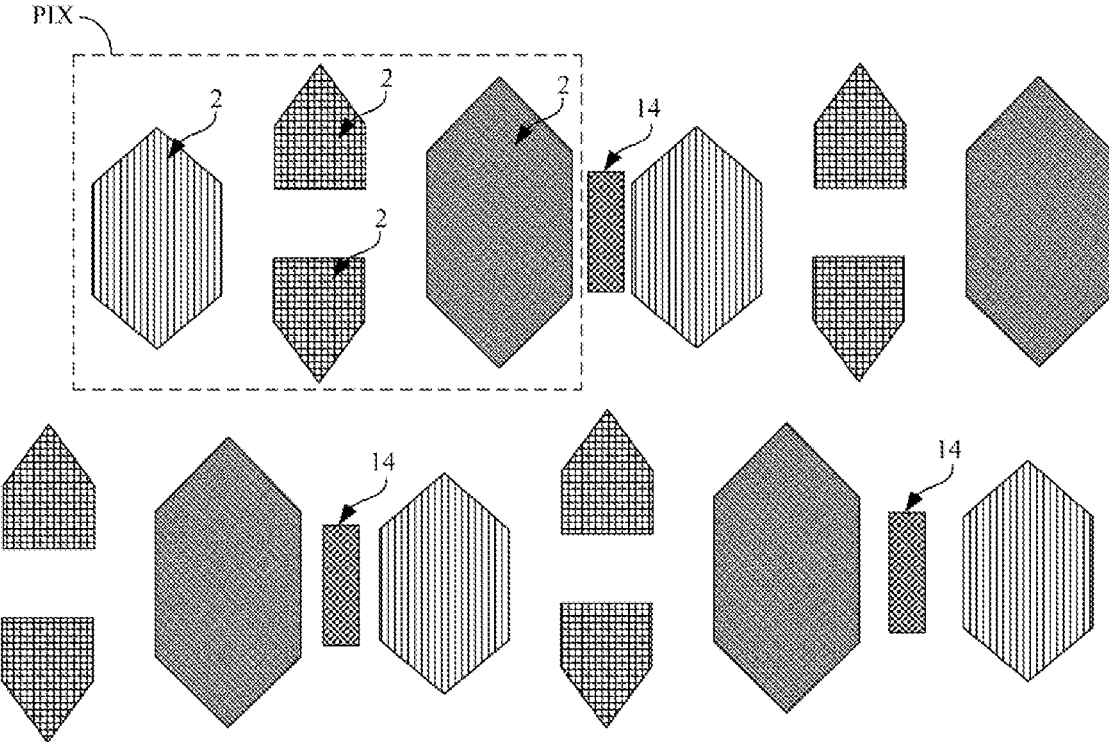
FIG. 17 is a schematic diagram illustrating how to arrange optical sensors and light emitting units in an embodiment of the present disclosure.

Generally, the fingerprint identification module includes a plurality of optical sensors 14 (e.g., photodiodes PIN, charge coupled devices CCD, etc.). The optical sensor 14 can generate a corresponding electrical signal according to received light, and based on the electrical signal, an image of a fingerprint at the corresponding position can be obtained. FIG. 17 is a schematic diagram illustrating distribution positions of the optical sensors and the light emitting units in an embodiment of the present disclosure. As shown in FIG. 17, FIG. 17 exemplarily illustrates a case where one pixel includes four light emitting units 2. The optical sensor 14 is arranged in a spaced region between the light emitting units 2, and an orthographic projection of the optical sensor 14 on the base substrate 1 and the orthographic projection of the light emitting units 2 on the base substrate 1 do not overlap. That is, the optical sensor 14 is located in the antireflection region 301.

It should be noted that shapes and sizes of the optical sensor 14 and the light emitting unit 2 shown in FIG. 17 are for an exemplary purpose only, and do not limit the technical solution of the present disclosure. In practical applications, the shapes and sizes of the optical sensor 14 and the light emitting unit 2 may be designed and adjusted according to practical requirements.

Figure 18:
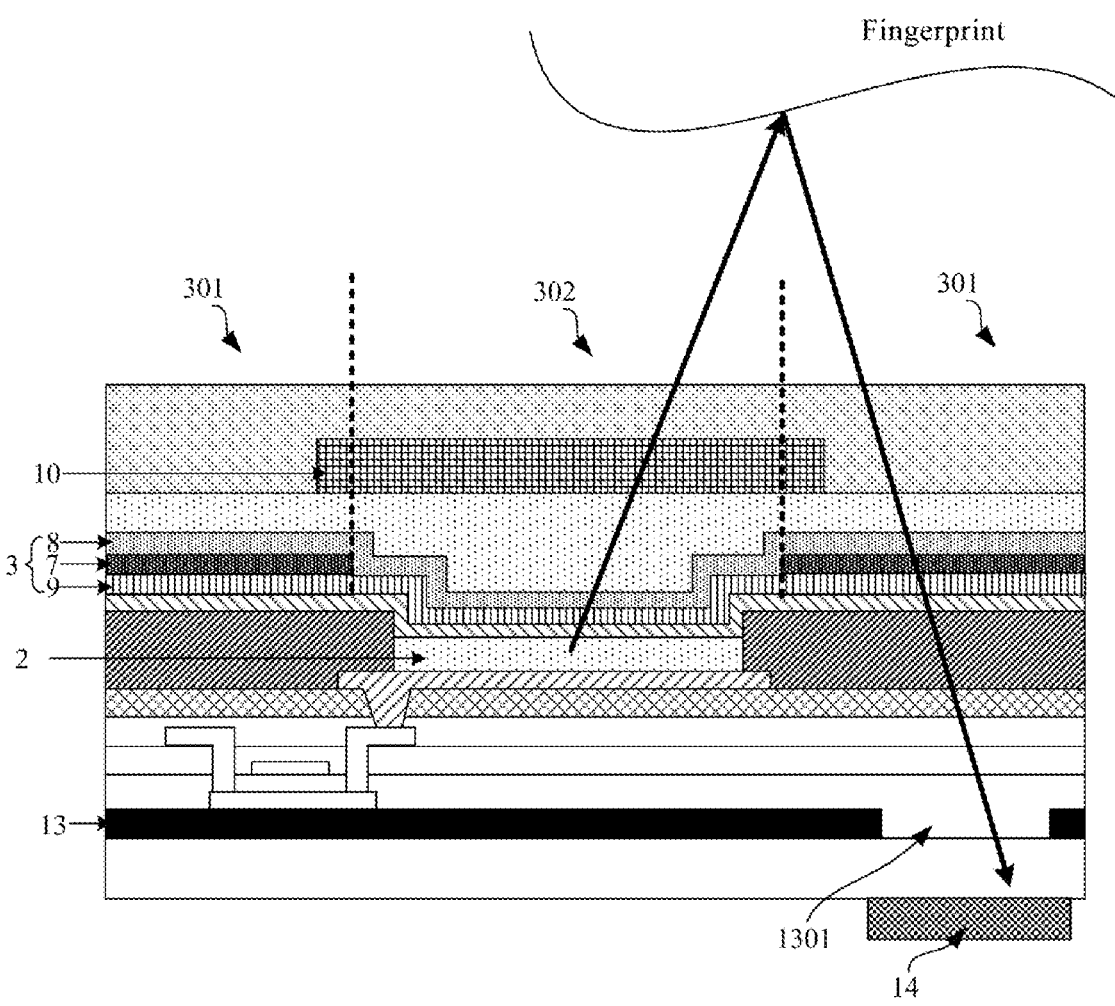
FIG. 18 is a schematic diagram of an optical path of a display substrate for fingerprint identification in an embodiment of the present disclosure.

FIG. 18 is a schematic diagram of an optical path of a display substrate for fingerprint identification in an embodiment of the present disclosure. As shown in FIG. 18, the light generated by the light emitting unit 2 irradiates a surface of a fingerprint, a part of the light is reflected at the surface of the fingerprint to form useful light for fingerprint identification, a respective optical sensor 14 in the fingerprint identification module generates a corresponding electrical signal according to the received useful light for fingerprint identification, and an external processing chip (not shown) can obtain a complete fingerprint image according to the electrical signal generated by the respective optical sensor 14.

In some embodiments, the display substrate further includes a light shielding layer 13, which is located between the fingerprint identification module and the light emitting unit 2, and is formed with a second via 1301. An orthographic projection of the second via on the base substrate 1 and an orthographic projection of a corresponding optical sensor 14 on the base substrate 1 overlap each other.

With continued reference to FIG. 18, in some embodiments, the fingerprint identification module is located on a side of the base substrate 1 away from the light emitting unit 2. That is, an under-screen fingerprint identification is achieved.

It should be noted that, FIG. 18 illustrates a case where the fingerprint identification module is located on a side of the base substrate 1 away from the light emitting unit 2, and the light shielding layer 13 is located between the driving layer 4 and the base substrate 1, which case is for an exemplary purpose only, and does not limit the technical solution of the present disclosure. In the embodiment of the present disclosure, it is satisfied as long as the fingerprint identification module is located on a side of the light emitting unit 2 close to the base substrate 1, and the light shielding layer 13 is located between light emitting unit 2 and the fingerprint identification module.

Figure 19:
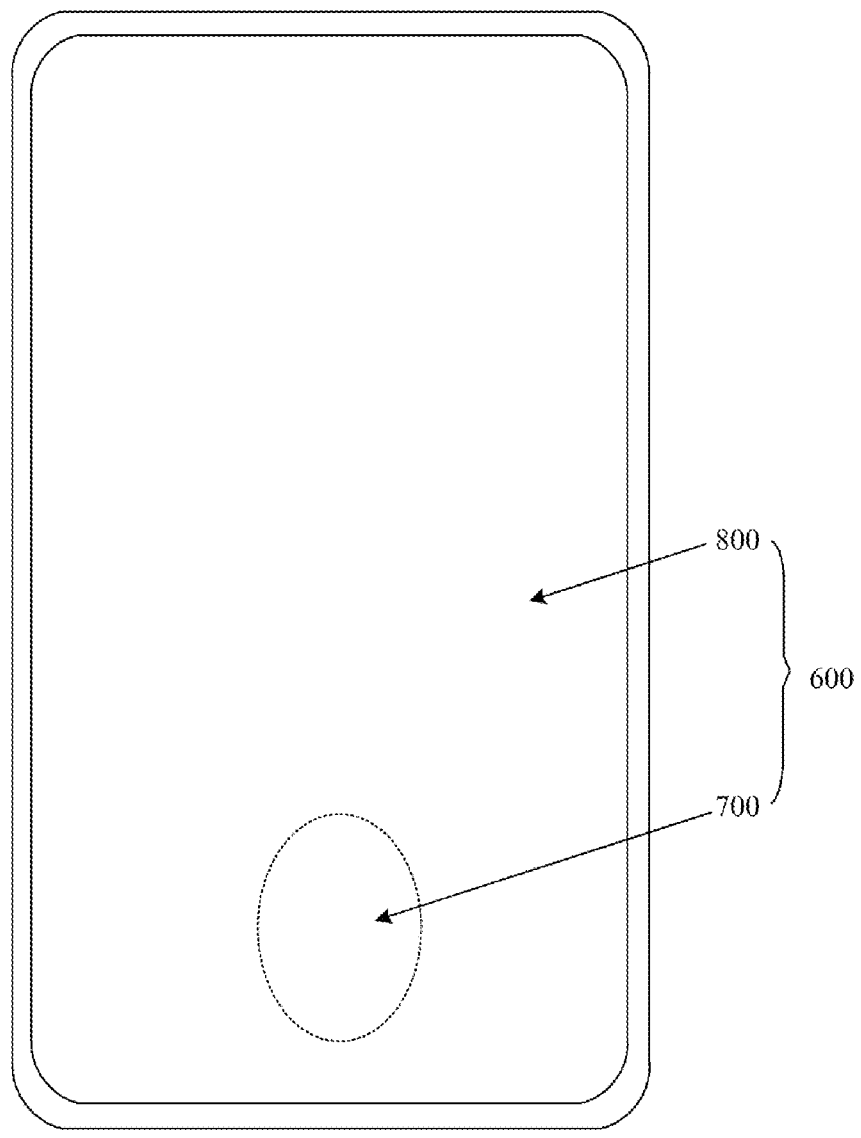
FIG. 19 is a schematic top view of a display substrate in an embodiment of the present disclosure.

FIG. 19 is a schematic top view of a display substrate in an embodiment of the present disclosure. As shown in FIG. 19, the display substrate includes a display region 600, and the display region 600 includes a fingerprint identification region 700 and non-fingerprint identification region 800. The fingerprint identification module is located in the fingerprint identification region 700. A ratio of a total area of the antireflection regions 301 to a total area of the transmission regions 302 in the fingerprint identification region 700 is less than or equal to a ratio of a total area of the antireflection regions 301 to a total area of the transmission regions 302 in the non-fingerprint identification region 800. That is, an area of the antireflection region 301 per unit area in the fingerprint identification region 700 is greater than an area of the antireflection region 301 per unit area in the non-fingerprint identification region 800.

In the embodiment of the present disclosure, the optical sensor 14 is located in the antireflection region 301, so the larger the area of the antireflection region 301 is, the larger the size that the optical sensor 14 can be set, the more useful light for fingerprint identification that the optical sensor 14 can receive, and the more beneficial to fingerprint identification. For this reason, in the fingerprint identification region, the area of the antireflection region 301 per unit area is set as large as possible under a condition that normal display is satisfied.

Figure 20:
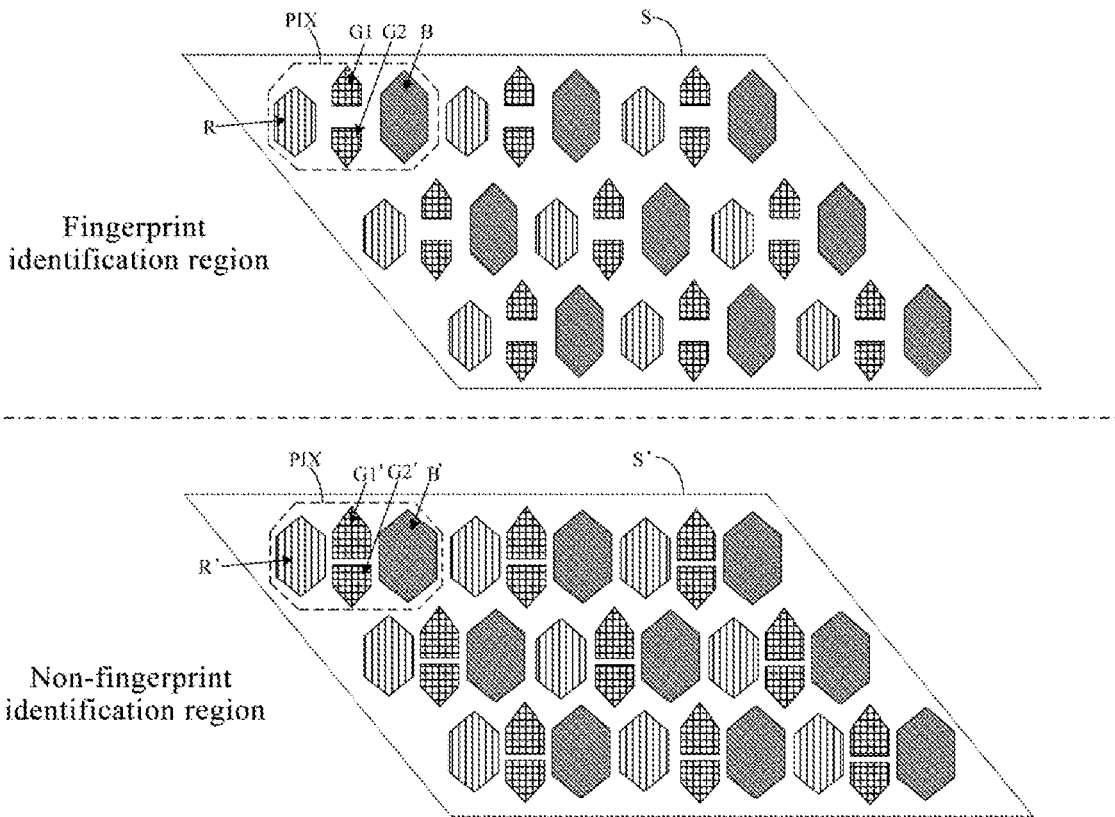
FIG. 20 is a schematic diagram illustrating a comparison between pixels distributed in a fingerprint identification region and a non-fingerprint identification region of a same area in an embodiment of the present disclosure.

FIG. 20 is a schematic diagram illustrating a comparison between pixels distributed in the fingerprint identification region and the non-fingerprint identification region of a same area in an embodiment of the present disclosure. As an alternative embodiment, as shown in FIG. 20, a pixel density of the fingerprint identification region 700 is equal to a pixel density of the non-fingerprint identification region 800. The pixel includes an area-adjustable light emitting unit, and an area of an orthographic projection of one area-adjustable light emitting unit in the fingerprint identification region 700 on the base substrate 1 is less than that of one area-adjustable light emitting unit in the non-fingerprint identification region 800 on the base substrate 1. The pixel density (Pixels Per Inch, PPI) refers to the number of pixels per inch.

Referring to the specific example shown in FIG. 20, a region S is a region in the fingerprint identification region 700, a region S' is a region in the non-fingerprint identification region 800, and the region S and the region S' have a same area. Each of the region S and the region S' is provided with nine pixels PIX each including four light emitting units R/G1/G2/B or R'/G1'/G2'/B', and each of the light emitting units in the pixel serves as an area-adjustable light emitting unit. In this case, an area of one area-adjustable light emitting unit R in the region S is less than that of one area-adjustable light emitting unit R' in the region S', an area of one area-adjustable light emitting unit G1 in the region S is less than that of one area-adjustable light emitting unit G1' in the region S', an area of one area-adjustable light emitting unit G2 in the region S is less than that of one area-adjustable light emitting unit G2' in the region S', and an area of one area-adjustable light emitting unit B in the region S is less than that of one area-adjustable light emitting unit B' in the region S'.

In this embodiment, the pixel density of the fingerprint identification region is equal to the pixel density of the non-fingerprint identification region. By reducing a size of at least a part of the light emitting units (i.e. the area-adjustable light emitting units) in the fingerprint identification region (i.e. the area of the transmission region in the fingerprint identification region is reduced, and the area of the antireflection region in the fingerprint identification region is increased), the spaced region between the light emitting units is increased, and an increase of the area of the antireflection region per unit area in the fingerprint identification region is achieved.

Figure 21:
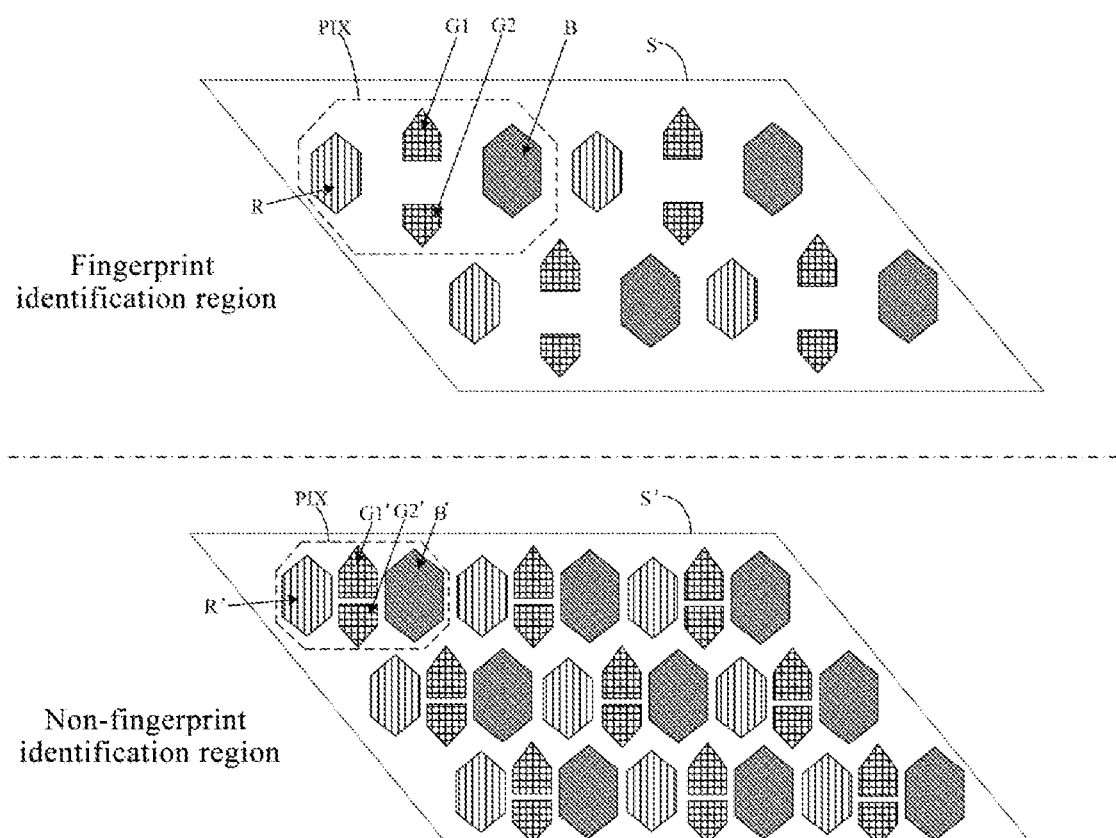
FIG. 21 is another schematic diagram illustrating a comparison between pixels distributed in a fingerprint identification region and a non-fingerprint identification region of a same area in an embodiment of the present disclosure.

FIG. 21 is another schematic diagram illustrating a comparison between pixels distributed in the fingerprint identification region and the non-fingerprint identification region of a same area in an embodiment of the present disclosure. As shown in FIG. 21, as another alternative embodiment, the pixel density of the fingerprint identification region 700 is less than the pixel density of the non-fingerprint identification region 800. The pixel includes at least one light emitting unit, and for any type of light emitting unit, an area of an orthographic projection of one light emitting unit of this type in the fingerprint identification region on the base substrate 1 is equal to an area of an orthographic projection of one light emitting unit of the same type in the non-fingerprint identification region on the base substrate 1.

Referring to the specific example shown in FIG. 21, a region S is a region in the fingerprint identification region 700, a region S' is a region in the non-fingerprint identification region 800, and the region S and the region S' have a same area. Four pixels PIX are arranged in the region S, nine pixels PIX are arranged in the region S', and each pixel includes four light emitting units R/G1/G2/B or R'/G1'/G2'/B'. The light emitting unit R in the region S and the light emitting unit R' in the region S' belong to a same type of light emitting unit and have a same area, the light emitting unit G1 in the region S and the light emitting unit G1' in the region S' belong to a same type of light emitting unit and have a same area, the light emitting unit G2 in the region S and the light emitting unit G2' in the region S' belong to a same type of light emitting unit and have a same area, and the light emitting unit B in the region S and the light emitting unit B' in the region S' belong to a same type of light emitting unit and have a same area.

In this embodiment, the light emitting units belonging to the same type in both the fingerprint identification region and the non-fingerprint identification region have a same size. By decreasing the pixel density of the fingerprint identification region, the spaced region between the light emitting units is increased (i.e., the area of the transmission region in the fingerprint identification region is decreased, and the area of the antireflection region is increased), and an increase in the area of the antireflection region per unit area in the fingerprint identification region is achieved.

It should be noted that, in some embodiments, the entire display region 600 may be used as the fingerprint identification region 700. In this case, the plurality of optical sensors 14 included in the fingerprint identification module may be uniformly distributed in the display region, so that the entire display region has the fingerprint identification function.

Figure 22:
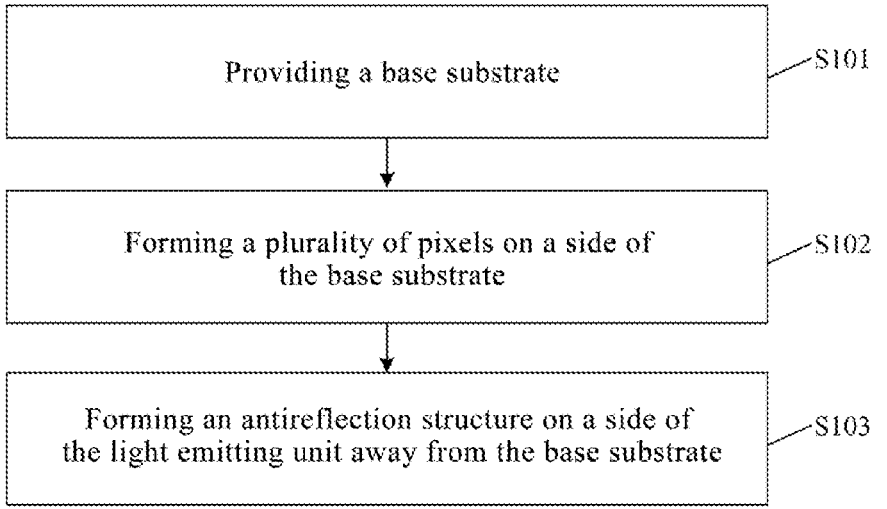
FIG. 22 is a flowchart of a method for manufacturing a display substrate according to an embodiment of the present disclosure.

Based on a same inventive concept, an embodiment of the present disclosure further provides a method for manufacturing a display substrate, which can be used for manufacturing the display substrate according to a previous embodiment. FIG. 22 is a flowchart of a method for manufacturing a display substrate according to an embodiment of the present disclosure. As shown in FIG. 22, the manufacturing method includes:

Step S101, providing a base substrate.

Step S102, forming a plurality of pixels on one side of the base substrate.

The pixel includes at least one light emitting unit.

Step 103, forming an antireflection structure on a side of the light emitting unit away from the base substrate.

The antireflection structure is divided into antireflection regions, an orthographic projection of the antireflection region on the base substrate and an orthographic projection of the light emitting unit on the base substrate do not overlap. The antireflection region of the antireflection structure is configure to reduce light reflectivity for light incident from a side of the antireflection structure away from the base substrate, and to allow a part of light irradiating the antireflection region to be transmitted.

In some embodiments, the antireflection structure 3 further includes transmission regions 302 in addition to the antireflection regions 301. The transmission region 302 of the antireflection structure 3 is configured to allow at least a part of light irradiating the transmission regions 302 to be transmitted.

For a detailed description of the structures formed in steps S101 to S103, reference may be made to the contents in the foregoing embodiments, and details are not repeated here.

Figure 23:
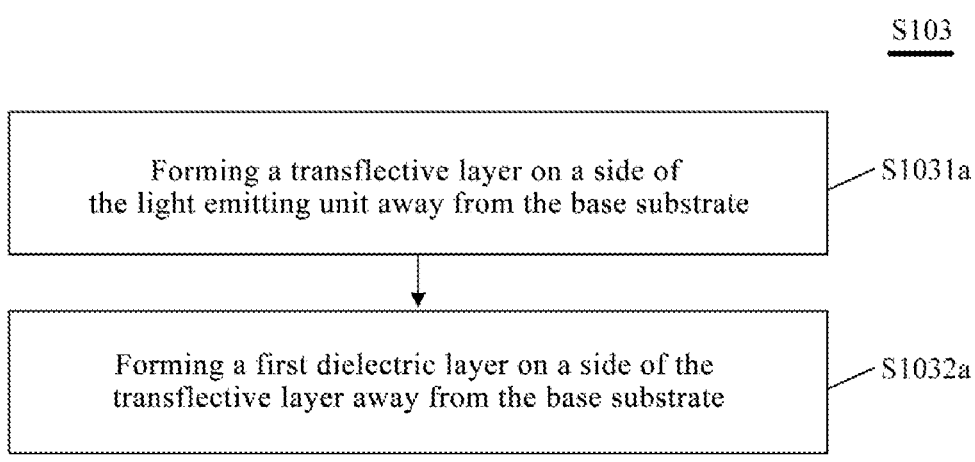
FIG. 23 is a specific flowchart of an alternative implementation method of a step S103 in an embodiment of the present disclosure.

FIG. 23 is a specific flowchart of an alternative implementation method of step S103 in an embodiment of the present disclosure. As shown in FIG. 23, in some embodiments, the antireflection structure includes a transflective layer and a first dielectric layer, in which case step S103 includes:

Step S1031a, forming a transflective layer on a side of the light emitting unit away from the base substrate.

The transflective layer is provided with a first via in the transmission region.

In some embodiments, the transflective layer may be formed based on a conventional patterning process. Specifically, a transflective material film is formed first, and then the transflective material film is processed through a patterning process to form a pattern of a transflective layer. There are various methods for forming a thin film, such as deposition, coating, sputtering, etc. The patterning process generally includes processes of photoresist coating, exposing, developing, etching, photoresist stripping, and the like.

Figure 24:
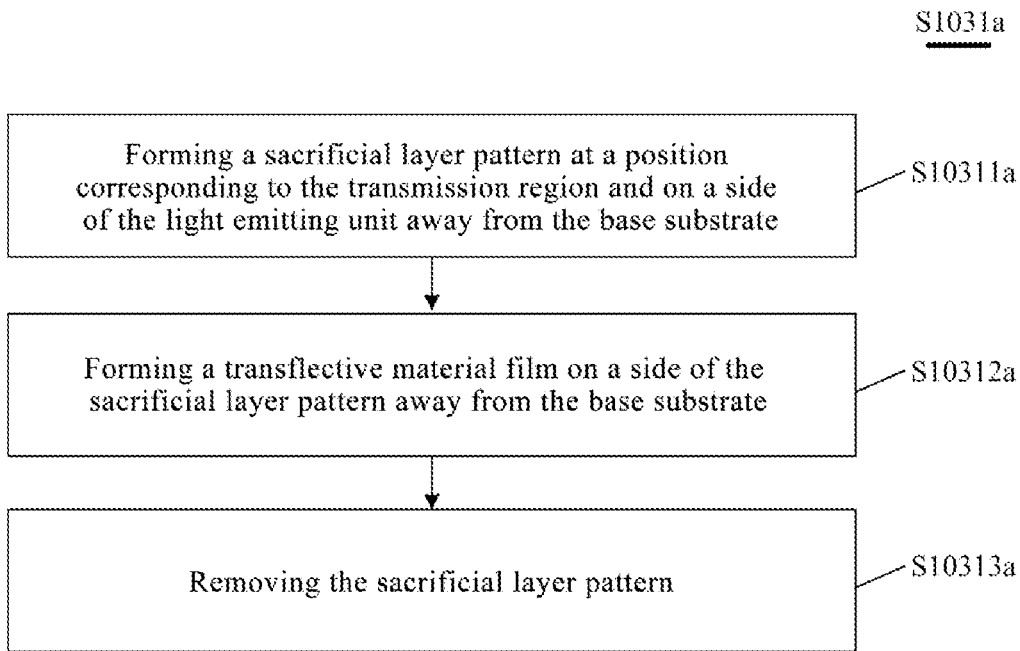
FIG. 24 is a specific flowchart of an alternative implementation method of a step S1031*a* in an embodiment of the present disclosure.

Alternatively, the transflective layer may be formed based on other processes in this embodiment. FIG. 24 is a specific flowchart of an alternative implementation method of step S1031*a* in an embodiment of the present disclosure. As shown in FIG. 24, in some embodiments, the transflective layer may be formed based on a lift-off technology, and step S1031*a* includes:

Step S10311*a*, forming a sacrificial layer pattern at a position corresponding to the transmission region and on a side of the light emitting unit away from the base substrate.

Figure 25:
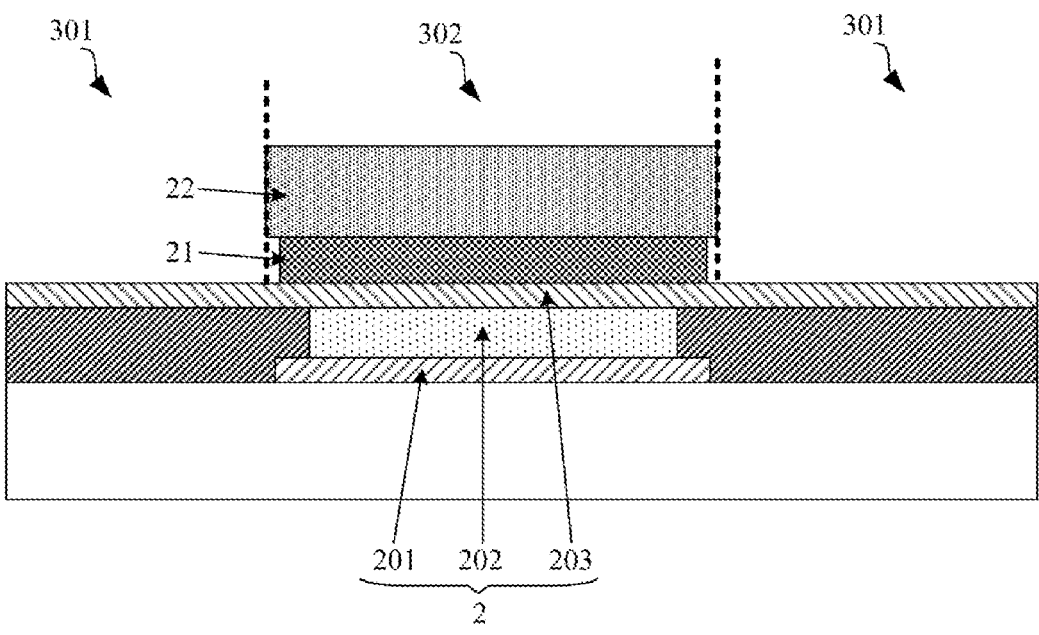
FIG. 25 is a schematic diagram of an intermediate product obtained after step S10311*a* is performed in an embodiment of the present disclosure.

FIG. 25 is a schematic diagram of an intermediate product obtained after step S10311*a* is performed in the embodiment of the present disclosure. As shown in FIG. 25, a sacrificial material film is first formed on a side of the light emitting unit away from the base substrate, and then the sacrificial material film is processed through a conventional patterning process to obtain a sacrificial layer pattern 21. It should be noted that, in the process of the patterning process, after the etching of the sacrificial material film is completed, a photoresist 22 exists on a side of the sacrificial layer pattern 21 away from the base substrate. In this case, the photoresist 22 directly above the sacrificial layer pattern 21 may be removed by a stripping process (no corresponding drawing is given), alternatively a stripping process may not be performed so that the photoresist 22 directly above the sacrificial layer pattern 21 remains (as shown in FIG. 25).

Since a material directly above the sacrificial layer pattern is removed together in a subsequent process of removing the sacrificial layer pattern, the photoresist directly above the sacrificial layer pattern may not be stripped after the etching of the sacrificial material film is completed in step S10311*a*, so that production processes can be effectively reduced, and the production cycle can be shortened. In addition, the photoresist directly above the sacrificial layer pattern is reserved, so that a large step difference is formed between the antireflection region and the transmission region, which is convenient for a part of a subsequently formed material film in the transmission region to be separated from a part of the subsequently formed material film in the antireflection region, due to the large step difference.

Step S10312*a*, forming a transflective material film on a side of the sacrificial layer pattern away from the base substrate.

Figure 26:
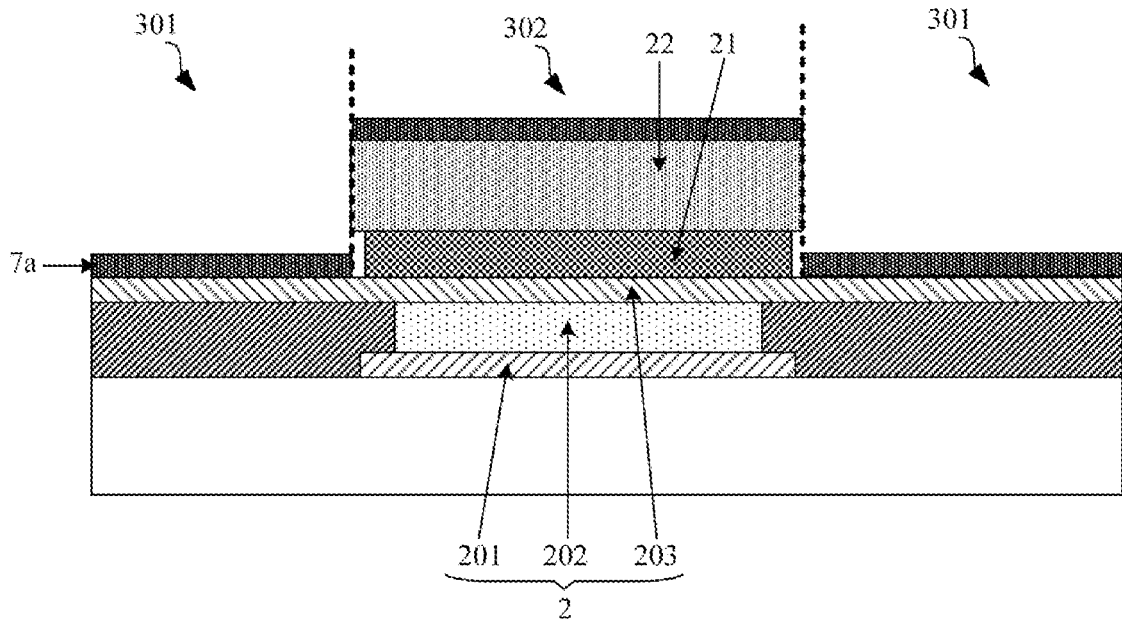
FIG. 26 is a schematic diagram of an intermediate product obtained after step S10312*a* is performed in an embodiment of the present disclosure.

FIG. 26 is a schematic diagram of an intermediate product obtained after step S10312*a* is performed in an embodiment of the present disclosure. As shown in FIG. 26, a transflective material film 7*a* is formed on a side of the sacrificial layer pattern 21 away from the base substrate through a deposition process. Due to the existence of the sacrificial layer pattern 21, a step difference is formed between a part of the transflective material film 7*a* in the transmission region 302 and a part of the transflective material film 7*a* in the antireflective region 301, which parts are separated from each other.

Step S10313*a*, removing the sacrificial layer pattern.

Figure 27:
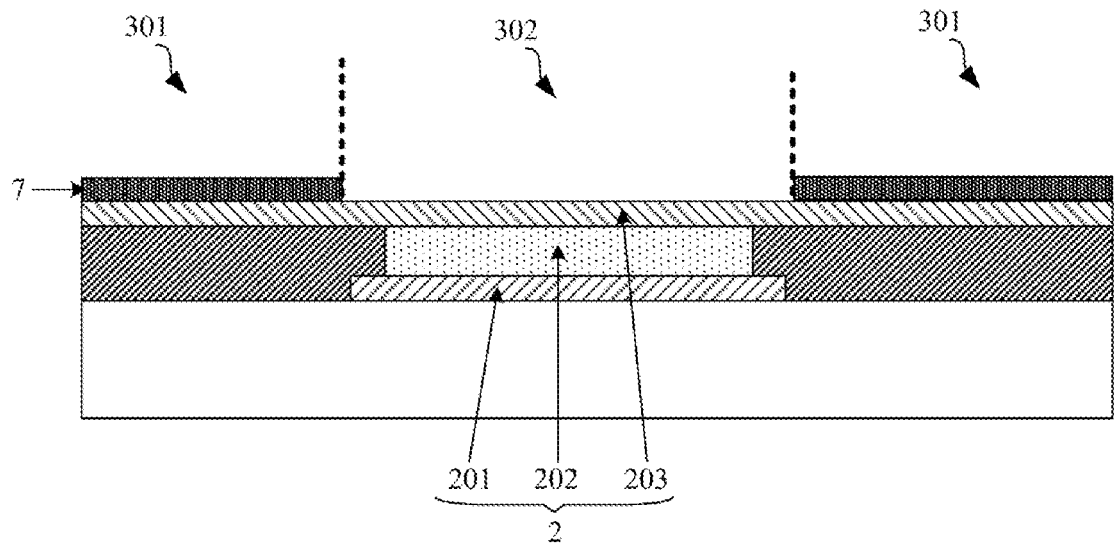
FIG. 27 is a schematic diagram of an intermediate product obtained after step S10313*a* is performed in an embodiment of the present disclosure.

FIG. 27 is a schematic diagram of an intermediate product obtained after step S10313*a* is performed in an embodiment of the present disclosure. As shown in FIGS. 26 and 27, the sacrificial layer pattern 21 is removed so that the part of the transflective material film 7*a* in the transmission region 302 (i.e., a part directly above the sacrificial layer pattern 21) is removed to form a first via, and the part of the transflective material film 7*a* in the antireflective region 301 constitutes the transflective layer 7.

Step S1032*a*, forming a first dielectric layer on a side of the transflective layer away from the base substrate.

The first dielectric layer may be located only in the antireflection region, alternatively may be located in both the antireflection region and the transmission region. The first dielectric layer is in contacted with a surface of the transflective layer away from the base substrate, and the first dielectric layer is configured such that: light is incident into the first dielectric layer from a side of the first dielectric layer away from the base substrate 1 and is reflected at the transflective layer, when first reflected light formed by the light reflected at the transflective layer returns to the surface of the first dielectric layer away from the base substrate, destructive interference between the first reflected light and second reflected light occurs, wherein the second reflected light is formed by light reflected at the surface of the first dielectric layer away from the base substrate. For a related description of the first dielectric layer, reference may be made to the corresponding contents in the foregoing embodiments, and details are not repeated here.

Figure 28:
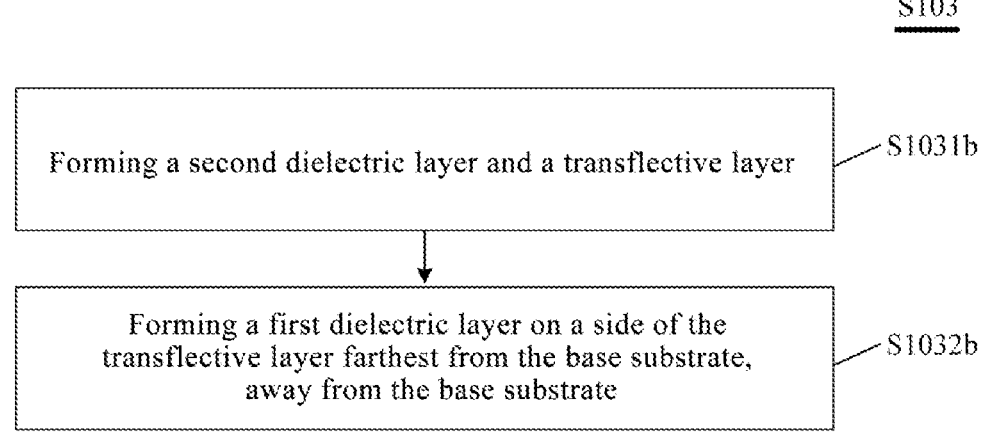
FIG. 28 is a specific flowchart of another alternative implementation method of step S103 in an embodiment of the present disclosure.

FIG. 28 is a specific flowchart of another alternative implementation method of step S103 in an embodiment of the present disclosure. As shown in FIG. 28, in some embodiments, the antireflection structure includes a transflective layer, a first dielectric layer, and a second dielectric layer, in which case step S103 includes:

Step S1031*b*, forming a second dielectric layer and a transflective layer.

The second dielectric layer is located on a side of the transflective layer close to the base substrate and is in contact with a surface of the transflective layer close to the base substrate. The second dielectric layer is configured such that: light is incident into the second dielectric layer from the side of the second dielectric layer close to the base substrate and is reflected at the transflective layer, when third reflected light formed by the light reflected at the transflective layer returns to the surface of the second dielectric layer close to the base substrate, destructive interference between the third reflected light and fourth reflected light occurs, wherein the fourth reflected light is formed by light reflected at the surface of the second dielectric layer close to the base substrate.

It should be noted that, where the second dielectric layer is located in both the antireflection region and the transmission region (i.e., the case shown in FIG. 11), the second dielectric layer and the transflective layer should be separately formed. Where the second dielectric layer is located in only the antireflection region (i.e., the case shown in FIG. 7), the second dielectric layer and the transflective layer may be simultaneously formed.

Figure 29:
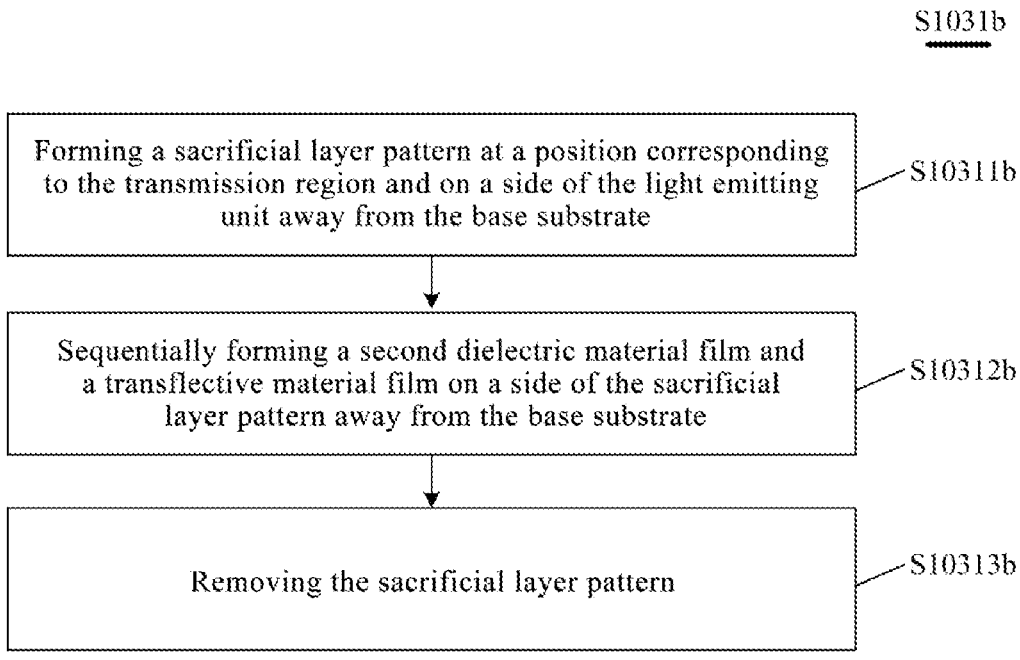
FIG. 29 is a specific flowchart of an alternative implementation method of step S1031*b* in an embodiment of the present disclosure.

FIG. 29 is a specific flowchart of an alternative implementation method of step S1031*b* in an embodiment of the present disclosure. As shown in FIG. 29, taking the antireflection structure adopting the case shown in FIG. 7 as an example, in some embodiments, the transflective layer and the second dielectric layer may be simultaneously formed based on a lift-off technology. Step S1031*b* includes:

Step S10311*b*, forming a sacrificial layer pattern at a position corresponding to the transmission region and on a side of the light emitting unit away from the base substrate.

For detail description of step S10311*b*, reference may be made to a foregoing description of step S10311*a*, which is not repeated here.

Step S10312*b*, sequentially forming a second dielectric material film and a transflective material film on a side of the sacrificial layer pattern away from the base substrate.

Figure 30:
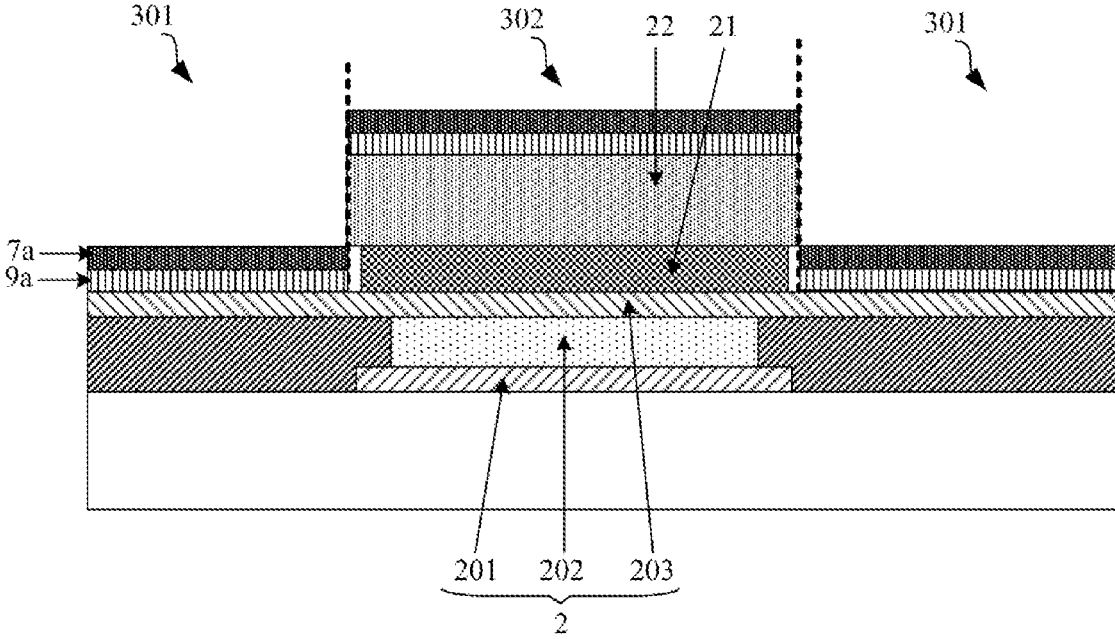
FIG. 30 is a schematic diagram of an intermediate product obtained after step S10312*b* is performed in an embodiment of the present disclosure.

FIG. 30 is a schematic diagram of an intermediate product obtained after step S10312*b* is performed in an embodiment of the present disclosure. As shown in FIG. 30, first, a second dielectric material film 9*a* is formed, and a step difference is formed between a part of the second dielectric material film 9*a* in the transmission region 302 and a part of the second dielectric material film 9*a* in the antireflection region 301, which parts are separated from each other; then, a transflective material film 7*a* is formed, and a step difference is formed between a part of the transflective material film 7*a* in the transmission region 302 and a part of the transflective material film 7*a* in the antireflective region 301, which parts are separated from each other.

It should be noted that, where the photoresist 22 does not exist above the sacrificial layer pattern 21 obtained after step S10311*b* is performed, a sum of thicknesses of all the material films formed in step S10312*b* should be less than or equal to a thickness of the sacrificial layer pattern 21 formed in step S10311*b*. Where the photoresist 22 exists directly above the sacrificial layer pattern 21 obtained after step S10311*b* is performed, a sum of the thicknesses of all the material films formed in step S10312*b* should be less than or equal to a sum of thicknesses of the sacrificial layer pattern 21 formed in step S10311*b* and the photoresist 22 located directly above the sacrificial layer pattern 21.

Step S10313*b*, removing the sacrificial layer pattern.

Figure 31:
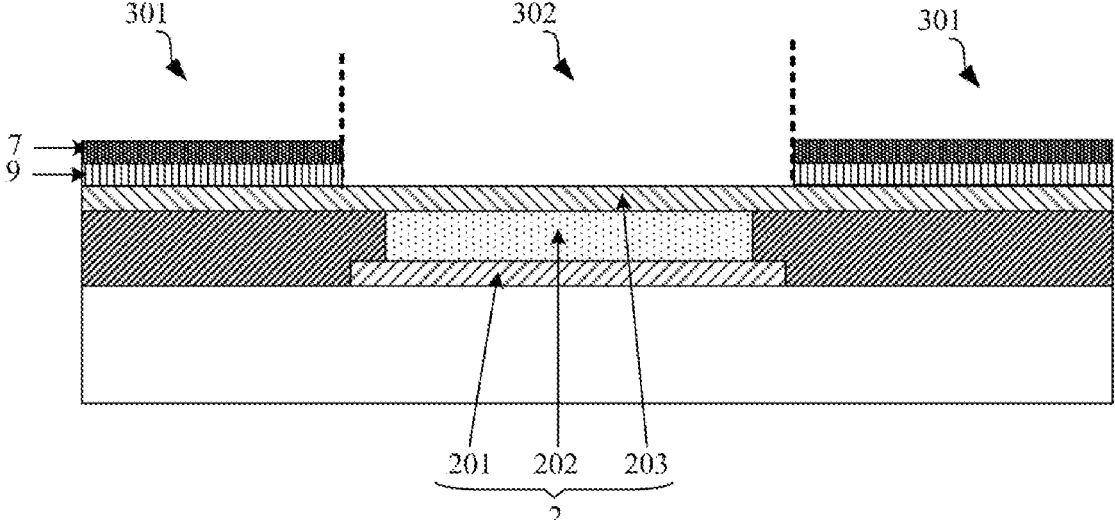
FIG. 31 is a schematic diagram of an intermediate product obtained after step S10313*b* is performed in an embodiment of the present disclosure.

FIG. 31 is a schematic diagram of an intermediate product obtained after step S10313*b* is performed in an embodiment of the present disclosure. As shown in FIGS. 30 and 31, the sacrificial layer pattern 21 is removed such that a part of the second dielectric material film 9*a* and the transflective material film 7*a* in the transmission region 302 (i.e., the part located directly above the sacrificial layer pattern) is removed, a part of the second dielectric material film 9*a* in the antireflection region 301 constitutes the second dielectric layer 9, and a part of the transflective material film 7*a* in the antireflection region 301 constitutes the transflective layer 7.

It should be noted that, where the numbers of the second dielectric layers and the transflective layers in the antireflection structure are both N (N is greater than or equal to 2 and N is an integer), the following steps are performed N times in step S10312*b*: forming a second dielectric material film; and forming a transflective material film on a side of a newly formed second dielectric material film away from the base substrate. When the sacrificial layer is removed in step S10313*b*, the N numbers of second dielectric layer and the N numbers of transflective layer can be obtained at a same time.

It should be noted that the above case of simultaneously forming the transflective layer and the second dielectric layer through the lift-off technology is only an alternative implementation solution in an embodiment of the present disclosure, and is particularly suitable for a scenario where the number the transflective layers and the second dielectric layers (the second dielectric layer is only located in the antireflection region) is large.

Step S1032*b*, forming a first dielectric layer on a side of the transflective layer farthest from the base substrate, away from the base substrate.

Figure 32:
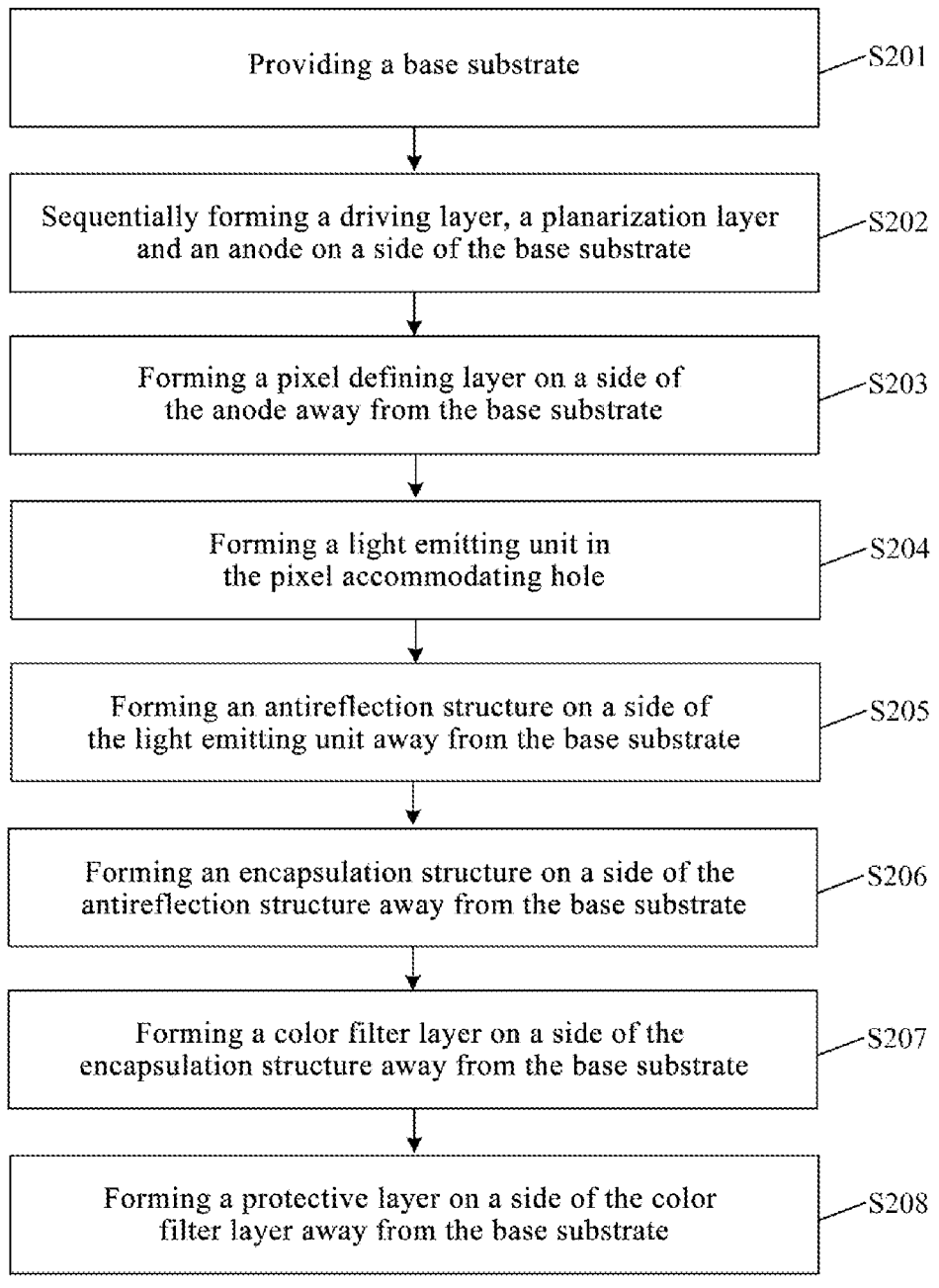
FIG. 32 is a flowchart of a method for manufacturing a display substrate according to an embodiment of the present disclosure.

FIG. 32 is a flowchart of a method for manufacturing a display substrate according to an embodiment of the present disclosure. As shown in FIG. 32, the manufacturing method includes:

Step S201, providing a base substrate.

Step S202, sequentially forming a driving layer, a planarization layer and an anode on one side of the base substrate.

The driving layer includes a driving circuit used for driving the light emitting unit to emit light, the driving circuit includes a driving transistor, and the anode is connected to a drain of a corresponding driving transistor through a via.

Step 203, forming a pixel defining layer on a side of the anode away from the base substrate.

A plurality of accommodating holes are formed in the pixel defining layer.

Step S204, forming a light emitting unit in the pixel accommodating hole.

Specifically, an organic functional layer and a cathode are formed in each accommodating hole. All the light emitting units may share a same cathode, and the cathode is a plate electrode.

Step S205, forming an antireflection structure on a side of the light emitting unit away from the base substrate.

For the description of step S205, reference may be made to the description of step S103, which is not repeated here.

Step S206, forming an encapsulation structure on a side of the antireflection structure away from the base substrate.

Step S207, forming a color filter layer on a side of the encapsulation structure away from the base substrate.

The color filter layer includes a plurality of color filter patterns in a one-to-one correspondence with the light emitting units. An orthographic projection of the color filter pattern on the base substrate covers an orthographic projection of the light emitting unit corresponding to the color filter pattern on the base substrate.

Step S208, forming a protective layer on a side of the color filter layer away from the base substrate.

The display substrate shown in FIG. 13 may be manufactured through the above steps S201 to S208, wherein the antireflection structure is located between the light emitting unit and the encapsulation structure.

FIG. 33 is a flowchart of a method for manufacturing a display substrate according to an embodiment of the present disclosure. As shown in FIG. 33, the manufacturing method includes:

Step S301, providing a base substrate.

Step S302, sequentially forming a driving layer, a planarization layer and an anode on one side of the base substrate.

The driving layer includes a driving circuit used for driving the light emitting unit to emit light, the driving circuit includes a driving transistor, and the anode is connected to a drain of a corresponding driving transistor through a via.

Step S303, forming a pixel defining layer on a side of the driving layer away from the base substrate.

A plurality of accommodating holes are formed in the pixel defining layer.

Step S304, forming a light emitting unit in the pixel accommodating hole.

Specifically, an organic functional layer and a cathode are formed in each accommodating hole. All the light emitting units may share a same cathode, and the cathode is a plate electrode.

Step S305, forming an encapsulation structure on a side of the light emitting unit away from the base substrate.

Step S306, forming an antireflection structure on a side of the encapsulation structure away from the base substrate.

For the description of step S306, reference may be made to the description of step S103, which is not repeated here.

Step S307, forming a color filter layer on a side of the antireflection structure away from the base substrate.

The color filter layer includes a plurality of color filter patterns in a one-to-one correspondence with the light emitting units. An orthographic projection of the color filter pattern on the base substrate covers an orthographic projection of the light emitting unit corresponding to the color filter pattern on the base substrate.

In some embodiments, a transmission region of the antireflection structure is a hollow structure, and the color filter pattern is filled in a corresponding hollow structure.

Step S308, forming a protective layer on a side of the color filter layer away from the base substrate.

The display substrate shown in FIG. 14A may be manufactured through the above steps S301 to S308, wherein the antireflection structure is located between the encapsulation structure and the protective layer.

Figure 34:
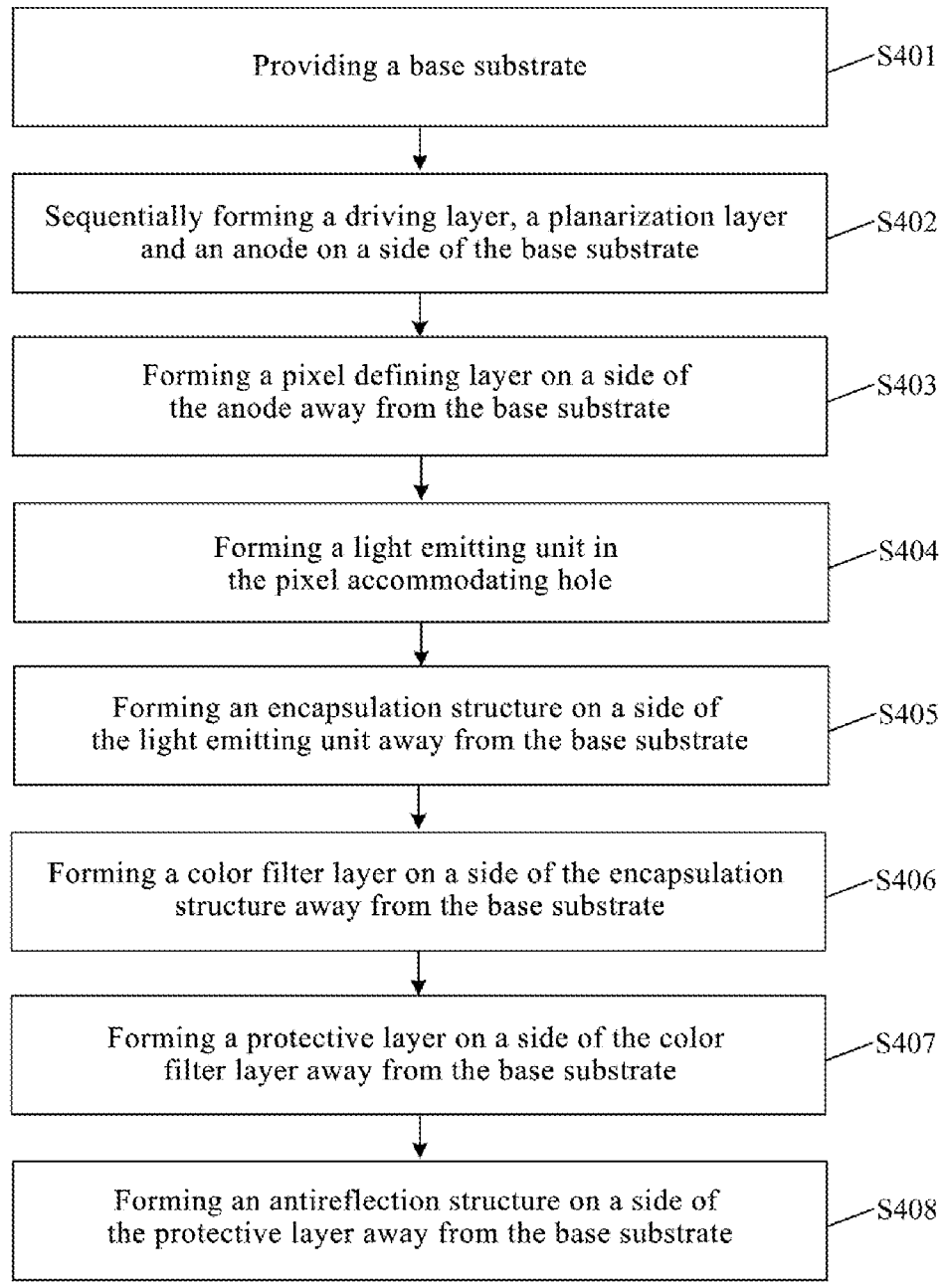
FIG. 34 is a flowchart of a method for manufacturing a display substrate according to an embodiment of the present disclosure.

FIG. 34 is a flowchart of a method for manufacturing a display substrate according to an embodiment of the present disclosure. As shown in FIG. 34, the manufacturing method includes:

Step S401, providing a base substrate.

Step S402, sequentially forming a driving layer, a planarization layer and an anode are on one side of the base substrate.

The driving layer includes a driving circuit used for driving the light emitting unit to emit light, the driving circuit includes a driving transistor, and the anode is connected to a drain of a corresponding driving transistor through a via.

Step S403, forming a pixel defining layer on a side of the driving layer away from the base substrate.

A plurality of accommodating holes are formed in the pixel defining layer.

Step S404, forming a light emitting unit in the pixel accommodating hole.

Specifically, an organic functional layer and a cathode are formed in each accommodating hole. All the light emitting units may share a same cathode, and the cathode is a plate electrode.

Step S405, forming an encapsulation structure on a side of the light emitting unit away from the base substrate.

In step S406, forming a color filter layer on a side of the encapsulation structure away from the base substrate.

The color filter layer includes a plurality of color filter patterns in a one-to-one correspondence with the light emitting units. An orthographic projection of the color filter pattern on the base substrate covers an orthographic projection of the light emitting unit corresponding to the color filter pattern on the base substrate.

Step S407, forming a protective layer on a side of the color filter layer away from the base substrate.

The display substrate shown in FIG. 14 may be manufactured through the steps S401 to S408, wherein the antireflection structure is located between the encapsulation structure and the protective layer.

Step S408, forming an antireflection structure on a side of the protective layer away from the base substrate.

For the description of step S408, reference may be made to the description of step S103, which is not repeated here.

The display substrate shown in FIG. 14B may be manufactured through the above steps S401 to S408, wherein the antireflection structure is located on the side of the protective layer away from the base substrate.

It should be noted that, in some embodiments, where the first dielectric layer is only located in the antireflection region and not located in the transmission region (for example, as shown in FIGS. 9 and 10), the first dielectric layer may alternatively be formed based on a lift-off technology. Specifically, after the sacrificial layer pattern and the transflective material film are formed, the first dielectric material film is formed. In this case, a patterning of the transflective material film and the first dielectric material film may be completed by stripping the sacrificial layer pattern. That is, the transflective layer and the first dielectric layer are formed by a lift-off process.

It should be noted that in some embodiments, the method for manufacturing a display substrate may further include a step of forming a fingerprint identification module, so that the manufactured display substrate has a fingerprint identification function. The fingerprint identification module is located on a side of light emitting unit close to the base substrate, and the fingerprint identification module includes a plurality of optical sensors, and an orthographic projection of the optical sensor on the base substrate and an orthographic projection of the light emitting unit on the base substrate do not overlap each other.

Further alternatively, the method for manufacturing a display substrate may further include a step of forming a light shielding layer. The light shielding layer is located between the fingerprint identification module and the light emitting unit, and a second via is formed in the light shielding layer. An orthographic projection of the second via on the base substrate and an orthographic projection of the fingerprint identification module on the base substrate overlap each other.

In some embodiments, the step of forming the light shielding layer is performed before the step of forming the driving layer, such that the formed light shielding layer is located between the base substrate and the driving layer.

In some embodiments, the step of forming the fingerprint identification module is performed after the step of forming the protective layer, so that the formed fingerprint identification module is located on a side of the base substrate away from the light emitting unit, that is, the under-screen fingerprint identification is achieved.

In this disclosed embodiment, it is satisfied as long as the fingerprint identification module is located on a side of the light emitting unit close to the base substrate, and the light shielding layer is located between the light emitting unit and the fingerprint identification module. Therefore, a corresponding adjustment may be performed to an order of the step of forming the light shielding layer and the step of forming the fingerprint identification module, according to a designed structure of a layer where the light shielding layer is located and a designed structure of a layer where the fingerprint identification module is located.

Based on a same inventive concept, an embodiment of the present disclosure further provides a display apparatus, which includes a display substrate, wherein the display substrate adopts the display substrate according to any one of the foregoing embodiments.

The display apparatus according to the embodiment of the present disclosure may be any product or component with a display function, such as a mobile phone, a tablet computer, a television, a monitor, a notebook computer, a digital photo frame, a navigator, or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A display substrate, comprising:
a base substrate;
a plurality of pixels on a side of the base substrate, wherein each of the plurality of pixels comprises at least one light emitting unit; and
an antireflection structure on a side of the light emitting unit away from the base substrate, wherein the antireflection structure is divided into antireflection regions, an orthographic projections of the antireflection region on the base substrate does not overlap an orthographic projection of the light emitting unit on the base substrate, and the antireflection region is configured to reduce light reflectivity of light incident from a side of the antireflection structure away from the base substrate and allow a part of light irradiating the antireflection regions to be transmitted, wherein the antireflection structure further comprises transmission regions in addition to the antireflection regions, and the transmission region is configured to allow transmission of at least a part of light irradiating the transmission region, wherein the antireflection structure comprises:

a transflective layer, which is provided with a first via in the transmission region;

a first dielectric layer, which is at least in the antireflection region, wherein the first dielectric layer is on a side of the transflective layer away from the base substrate and in contact with a surface of the transflective layer away from the base substrate;

wherein the first dielectric layer is configured such that: light is incident into the first dielectric layer from a side of the first dielectric layer away from the base substrate and is reflected at the transflective layer, when first reflected light formed by the light reflected at the transflective layer returns to a surface of the first dielectric layer away from the base substrate, destructive interference between the first reflected light and second reflected light occurs, wherein the second reflected light is formed by light reflected at the surface of the first dielectric layer away from the base substrate, wherein the display substrate further comprises:

a color filter layer on a side of the light emitting unit away from the base substrate, wherein the color filter layer comprises a plurality of color filter patterns in a one-to-one correspondence with the light emitting units, and an orthographic projection of each of the plurality of color filter patterns on the base substrate covers an orthographic projection of the light emitting unit corresponding to the color filter pattern on the base substrate;

an encapsulation structure between the light emitting unit and the color filter layer; and a protective layer on a side of the color filter layer away from the base substrate, wherein the display substrate further comprises:

a fingerprint identification module on a side of the light emitting unit close to the base substrate, wherein the fingerprint identification module comprises a plurality of optical sensors, and an orthographic projection of each of the plurality of optical sensors on the base substrate does not overlap an orthographic projection of the light emitting unit on the base substrate, wherein the display substrate comprises a display region, the display region comprises a fingerprint identification region and a non-fingerprint identification region, the fingerprint identification module is in the fingerprint identification region; and a ratio of a total area of the antireflection regions to a total area of the transmission regions in the fingerprint identification region is greater than or equal to a ratio of a total area of the antireflection regions to a total area of the transmission regions in the non-fingerprint identification region.

2. The display substrate according to claim 1, wherein the antireflection structure further comprises:

a second dielectric layer, which is at least in the antireflection region, wherein the second dielectric layer is on a side of the transflective layer close to the base substrate and in contact with a surface of the transflective layer close to the base substrate;

wherein the second dielectric layer is configured such that: light is incident into the second dielectric layer from the side of the second dielectric layer close to the base substrate and is reflected at the transflective layer, when third reflected light formed by the light reflected at the transflective layer returns to a surface of the second dielectric layer close to the base substrate, destructive interference between the third reflected light and fourth reflected light occurs, wherein the fourth reflected light is formed by light reflected at the surface of the second dielectric layer close to the base substrate.

3. The display substrate according to claim 2, comprising one of the first dielectric layer, N of the transflective layers, and N of the second dielectric layers, where N is greater than or equal to 2, and N is an integer;

the second dielectric layers and the transflective layers are sequentially and alternately arranged along a direction away from the base substrate; and the first dielectric layer is on a side of a transflective layer, of the transflective layers farthest from the base substrate, away from the base substrate, and is in contact with a surface of the transflective layer farthest from the base substrate, away from the base substrate.

4. The display substrate according to claim 1, wherein the first dielectric layer is further in the transmission region, and the first dielectric layer is multiplexed as a light extraction layer.

5. The display substrate according to claim 4, wherein the light extraction layer is of a single layer structure, a double layer structure, or a multi-layer structure.

6. The display substrate according to claim 2, wherein a material of the second dielectric layer comprises a transparent conductive material.

7. The display substrate according to claim 1, wherein a material of the transflective layer comprises a metal material.

8. The display substrate according to claim 1, wherein the antireflection structure is between the light emitting unit and the encapsulation structure;

or the antireflection structure is between the encapsulation structure and the protective layer;

or the antireflection structure is on a side of the protective layer away from the base substrate.

9. The display substrate according to claim 1, wherein the antireflection structure is in a same layer as the color filter pattern, and a thickness of the color filter pattern is greater than a thickness of the antireflection structure; and an edge portion of the color filter pattern covers a surface of the antireflection structure away from the base substrate.

10. The display substrate according to claim 1, wherein the transmission regions are in a one-to-one correspondence with the light emitting units;

an orthographic projection of the color filter pattern on the base substrate covers an orthographic projection of the transmission region corresponding to the color filter pattern on the base substrate; and the orthographic projection of the transmission region on the base substrate covers an orthographic projection of the light emitting unit corresponding to the transmission region on the base substrate.

11. The display substrate according to claim 10, wherein the orthographic projection of the color filter pattern on the base substrate, the orthographic projection of the transmission region corresponding to the color filter pattern on the base substrate, and the orthographic projection of the light emitting unit corresponding to the color filter pattern on the base substrate have a same shape.

12. The display substrate according to claim 11, wherein a distance between an edge, on one side, of the orthographic projection of the color filter pattern on the base substrate and an edge, on this side, of the orthographic projection of the transmission region corresponding to the color filter pattern on the base substrate is d1; and a distance between an edge, on one side, of the transmission region corresponding to the color filter pattern on the base substrate and an edge, on this side, of the light emitting unit corresponding to the color filter pattern on the base substrate is d2, where d2 is greater than d1.

13. The display substrate according to claim 1, wherein the ratio of the total area of the antireflection regions to the total area of the transmission regions in the fingerprint identification region is greater than the ratio of the total area of the antireflection regions to the total area of the transmission regions in the non-fingerprint identification region;

a pixel density of the fingerprint identification region is equal to a pixel density of the non-fingerprint identification region; and the pixel comprises an area-adjustable light emitting unit, and an area of an orthographic projection of one area-adjustable light emitting unit in the fingerprint identification region on the base substrate is less than an area of an orthographic projection of one area-adjustable light emitting unit in the non-fingerprint identification region on the base substrate.

14. The display substrate according to claim 1, wherein the ratio of the total area of the antireflection regions to the total area of the transmission regions in the fingerprint identification region is greater than the ratio of the total area of the antireflection regions to the total area of the transmission regions in the non-fingerprint identification region;

a pixel density of the fingerprint identification region is less than a pixel density of the non-fingerprint identification region;

the pixel comprises at least one light emitting unit, and for any type of light emitting unit, an area of an orthographic projection of one light emitting unit of this type in the fingerprint identification region on the base substrate is equal to an area of an orthographic projection of one light emitting unit of the same type in the non-fingerprint identification region on the base substrate.

* * * * *